US006376842B1

(12) United States Patent
Yamada

(10) Patent No.: US 6,376,842 B1
(45) Date of Patent: Apr. 23, 2002

(54) OPTICAL SYSTEM FOR CHARGED-PARTICLE-BEAM MICROLITHOGRAPHY APPARATUS EXHIBITING REDUCED THIRD- AND FIFTH-ORDER ABERRATIONS

(75) Inventor: Atsushi Yamada, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/270,449

(22) Filed: Mar. 16, 1999

(30) Foreign Application Priority Data

Mar. 16, 1998 (JP) .......................................... 10-065493
Mar. 18, 1998 (JP) .......................................... 10-068264

(51) Int. Cl.$^7$ ............................. G01K 1/08; H01J 3/14; H01J 3/26
(52) U.S. Cl. ........... 250/398; 250/492.21; 250/396 ML; 250/492.2
(58) Field of Search ...................... 250/492.2, 396 ML, 250/398, 210

(56) References Cited

U.S. PATENT DOCUMENTS 5,635,719 A * 6/1997 Petric .................. 250/396 ML
5,847,402 A * 12/1998 Nakasuji .................. 250/492.2
5,952,667 A * 9/1999 Shimizu .................. 250/492.2

OTHER PUBLICATIONS

Chu et al., "Numerical Analysis of Electron Beam Lithography Systems. Part III: Calculation of the Optical Properties of Electron Focusing Systems and Dual–Channel Deflection Systems with Combined Magnetic and Electrostatic Fields," *Optik 61*: 121–145 (1982).
Goto et al., "MOL (Moving Objective Lens) Formulation of Deflective Aberration Free System," *Optik 48*:255–270 (1977).
Hosokawa, "Systematic Elimination of Third Order Aberrations in Electron Beam Scanning System," *Optik 56*: 21–30 (1980).
Pfeiffer et al., "Advanced Deflection Concept for Large Area, High Resolution E–Beam Lithography," *J. Vac. Sci. Technol 19*:1058–1063 (1981).
Sturans et al., "Optimization of Variable Axis Immersion Lens for Resolution and Normal Landing," *J. Vac. Sci. Technol.* 8:1682–1685 (1990).
Zhu et al., "Dynamic Correction of Aberrations in Focusing and Deflection Systems with Shaped Beams," *SPIE* 2522:66–77 (1995).

* cited by examiner

*Primary Examiner*—Jack Berman
*Assistant Examiner*—Kalimah Fernandez
(74) *Attorney, Agent, or Firm*—Klarquist Sparkman LLP

(57) ABSTRACT

Charged-particle-beam (CPB) optical systems are disclosed, especially for use in CPB microlithography apparatus. A typical such system preferably includes first and second projection lenses (preferably in a Symmetric Magnetic Doublet configuration) and an aberration-correcting deflector system preferably comprising first and second deflector groups. Each deflector group preferably comprises multiple (e.g., three) deflectors displaced in an axial direction in association with the respective projection lenses. One or more deflectors in each group can comprise multiple micro-deflectors linearly arranged in an optical axis direction. The micro-deflectors can extend fully between the object surface and aperture surface of the projection lens and/or between the aperture surface and image surface of the projection lens. The deflectors in each group collectively form a deflection field that corrects off-axis third-order aberrations and on-axis third-order aberrations of the projection lenses substantially equally. The deflectors can also be configured to also minimize fifth-order blur generated by the deflection.

21 Claims, 12 Drawing Sheets

L=5mm

R1=5mm
R2=9mm

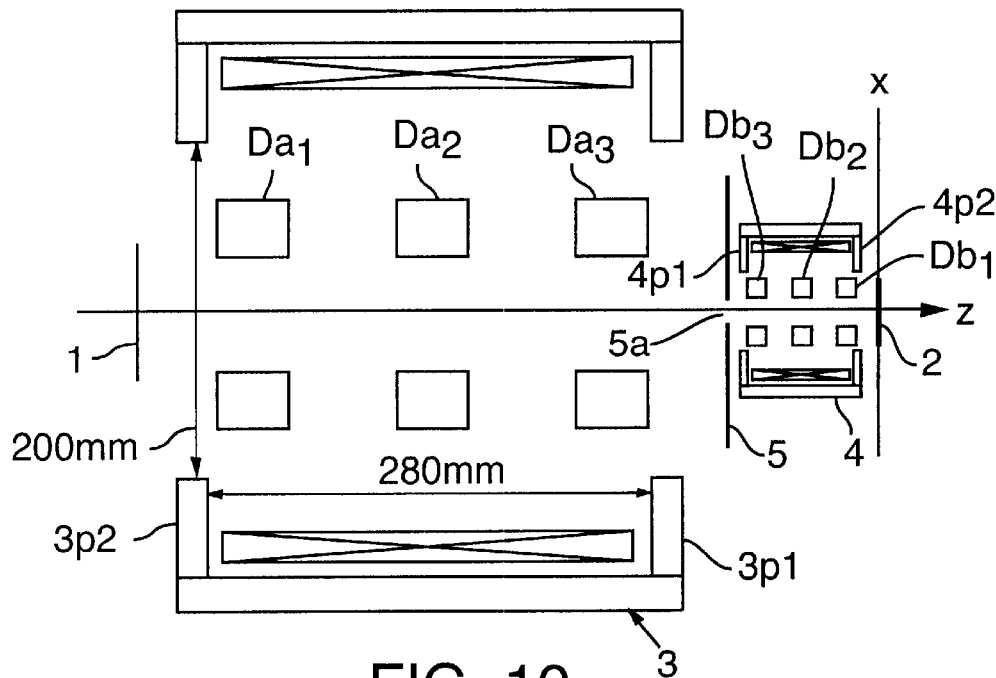
FIG. 10
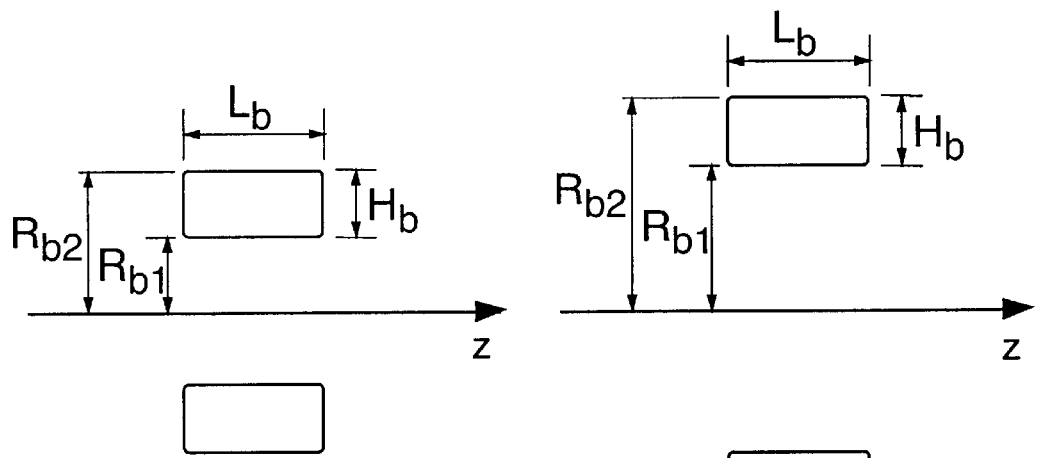
FIG. 11(a)
FIG. 11(b)

OPTICAL SYSTEM FOR CHARGED-PARTICLE-BEAM MICROLITHOGRAPHY APPARATUS EXHIBITING REDUCED THIRD- AND FIFTH-ORDER ABERRATIONS

FIELD OF THE INVENTION

The present invention pertains to microlithography systems that employ a charged particle beam to transfer a pattern (such as a circuit pattern for an integrated circuit) onto a sensitive substrate (such as a semiconductor wafer). More specifically, the invention pertains to methods and apparatus for reducing aberrations in such systems.

BACKGROUND OF THE INVENTION

There has been much recent progress in semiconductor processing technology, including so-called "microlithography" technology. Current optical microlithography apparatus utilize light (typically ultraviolet light) for exposure. To further improve the resolution of microlithography apparatus, light having increasingly shorter wavelengths is preferably used. However, there are practical limits to the extent to which the wavelength of light can be reduced for microlithography.

To solve such problems, X-ray microlithography has been under development. However, X-ray technology for microlithography is plagued with many serious problems, including a current inability to fabricate an acceptable reticle for X-ray lithography. Consequently, practical X-ray microlithography has not yet been realized.

Another approach to improving the resolution of microlithography has been the use of charged-particle-beam (CPB) apparatus, such as electron-beam apparatus. Fortunately, many aspects of CPB optics are well understood in view of many years' experience in using CPB optics in instruments such as electron microscopes and the like. With respect to CPB microlithography, various optical configurations have been proposed, such as MOL (Moving Objective Lens; Goto et al., *Optik* 48:255, 1977), VAL (Variable Axis Lens; Pfeiffer and Langner, *J. Vac. Sci. Technol.* 19:1058, 1981), and VAIL (Variable Axis Immersion Lens; Sturans et al., *J. Vac. Sci. Technol.* B8:1682, 1982).

However, whenever a circuit pattern is exposed using a CPB optical system such as any of the listed systems, image blur generated by geometric aberrations of the CPB optical system is very high, which is problematic for practical applications. In addition, in CPB exposure apparatus based on a multiple-deflection theory (directed to reducing third-order aberrations, Hosokawa, *Optik* 56:21, 1980), a number of deflectors equal to the number of aberrations to be eliminated is used. The principal aberrations discussed in the Hosokawa paper are longitudinal coma aberration, radial coma aberration, astigmatism, and chromatic aberrations; hence, at least four deflectors are required to reduce these aberrations. An additional deflector is normally used for controlling the angle of incidence of the beam onto the reticle and substrate. Hence, five deflectors are typically required. In the Hosokawa paper, a respective linear equation is used to define the current applied to each deflector, and the linear equations are combined to form a set of simultaneous linear equations. The set of simultaneous linear equations is then solved to provide a respective current for each deflector. Unfortunately, however, in such a scheme the trajectory of the beam is unnatural. ("Unnatural" in this context means that the trajectory $W_m$ of the beam changes greatly. The CPB optical system has three principal rays: $W_a$, $W_b$, and $W_m$. Chu et al., *Optik* 61:121, 1982. $W_a$ and $W_b$ are determined by lens conditions, and $W_m$ is determined by both the lenses and the deflectors.) As a result, higher-order aberrations (i.e., higher order than third order) increase sharply even when third-order aberrations are largely eliminated. Moreover, the solutions to the set of simultaneous linear equations change continuously and thus require constant recalculation.

Furthermore, in conventional systems as summarized above, aberrations are calculated only up to the third-order aberrations; no calculations are performed of fifth-order or higher-order aberrations. However, in order to achieve the requisite imaging accuracy using a CPB microlithography apparatus to expose a pattern having a critical feature dimension of less than 0.15 $\mu$m, fifth-order and higher-order aberrations must be reduced as much as possible.

By way of example, in conventional SMD optical systems, whenever the magnification (M) exhibited by such a system is equal to 4 (i.e., whenever M=4) and the inside radius of a deflector on the image side is 25 mm, the inside radius of a deflector on the object side is 100 mm. In conventional SMD systems, deflectors are usually situated along the optical axis inside one or both lenses. The example situation just mentioned would require that the inside radius of the lens on the object side be very large. As a result, not only must the size and the weight of the lens itself be very large, but also the radius of a "lens column" (i.e., lens housing) containing the lens must be even larger. This results in a corresponding increase in the size and complexity of the microlithography apparatus utilizing such a lens. Other detriments with such size increases are greater deviations from design specification due to assembly errors and the like (e.g., positional errors of the optical axis and displacements of the respective rotation angle and the like of the deflectors).

Also, with conventional SMD optical systems, the number of deflectors for correcting aberrations is limited, which correspondingly limits the degrees of freedom for aberration-reducing adjustments. Consequently, blur due to aberrations is very sensitive to any displacement of the axial position of the deflectors and any displacement of the angular orientation of each deflector radially about the optical axis. This situation greatly increases the difficulty of performing aberration-reducing micro-adjustments of the SMD optical system. The end result is that achieving a level of performance from a conventional CPB microlithography apparatus has tended to fall substantially below design specifications.

SUMMARY OF THE INVENTION

In view of the foregoing shortcomings of the prior art, an object of the invention is to provide projection-optical systems for CPB microlithography apparatus that exhibit satisfactorily reduced aberrations and blur, even with a large main field.

According to one aspect of the invention, apparatus are provided for projecting an image of a pattern, defined by a reticle, onto a substrate using a charged particle beam. An embodiment of such an apparatus comprises a projection-optical system situated and configured to receive a charged particle beam passing through an illuminated region (i.e., a region irradiated by the charged particle beam) of the reticle and form an image of the illuminated region on a corresponding region of the substrate. The apparatus also comprises six deflectors associated with the projection-optical system. The deflectors are configured and situated to correct an on-axis aberration of the beam and a corresponding off-axis aberration of the beam, wherein the off-axis aberration is corrected substantially equally with the correction of the on-axis aberration. The projection-optical system in such an embodiment preferably satisfies a Symmetric Magnetic Doublet (SMD) condition. Also, the deflectors preferably have axial positions, relative to an axial position of the substrate, of Z1–Z6, respectively, that satisfy the expressions:

$$Z1=(-L)-M(Z6)$$

$$Z2=(-L)-M(Z5)$$

$$Z3=(-L)-M(Z4)$$

wherein an axial direction leading from the substrate to the reticle is regarded as a negative axial direction, "L" is the "column length" of the projection-optical system, and 1/M is the demagnification ratio of the projection-optical system. (An axial direction leading from the substrate to the reticle is regarded as a negative axial direction.)

According to another embodiment, an apparatus is provided that comprises a projection-lens system configured and situated so as to perform the following: (1) receive a charged particle beam passing through an illuminated region of the reticle and form an image of the illuminated region on a corresponding region of the substrate, (2) form a lens field, and (3) satisfy a SMD condition. The apparatus also comprises a deflector system configured and situated so as to form a deflection field. The deflector system comprises a first set of multiple (at least two) deflectors axially arranged on a reticle side of the projection-lens system, and a second set of multiple (at least two) deflectors axially arranged on a substrate side of the projection-lens system. The deflector system performs a correction of third-order aberrations of the beam sufficiently such that off-axis third-order aberrations are corrected substantially equally with correction of on-axis third-order aberrations. The respective inside radii of the deflectors of the first and second sets are configured so as to reduce fifth-order blur generated by deflection of the beam. In addition, the inside radius, outside radius, and axial length of the deflectors in the first set are preferably M times the inside radius, outside radius, and axial length, respectively, of the deflectors in the second set, wherein 1/M is the demagnification ratio of the projection-lens system.

Each of the first and second sets of deflectors can comprise "n" respective deflectors, wherein "n" is an integer greater than two. With such a configuration, the respective nth deflectors of the first and second sets are preferably axially situated closest to each other of all the deflectors in the first and second sets, respectively. Furthermore, the respective nth deflector of the first and second sets preferably have a smaller inside radius, outside radius, and axial length of the other deflectors in the respective first and second sets.

According to another aspect of the invention, certain improvements are provided to apparatus for projecting an image of a pattern, defined by a reticle, onto a substrate using a charged particle beam. A first set of "n" deflectors $(Da_1, Da_2, \ldots, Da_n)$ is provided (wherein "n" is at least two) on the reticle side of the projection-optical system of such an apparatus. A second set of "n" deflectors $(Db_1, Db_2, \ldots, Db_n)$ is provided (wherein "n" is at least two) on the substrate side of the projection-optical system. The nth deflector $Da_n$ in the first set has an inside radius, outside radius, and axial length that individually are smaller than respective such dimensions of all other deflectors of the first set. Similarly, the nth deflector $Db_n$ in the second set has an inside radius, outside radius, and axial length that individually are smaller than respective such dimensions of all other deflectors of the second set.

According to yet another aspect of the invention, a projection-optical system is provided that comprises a projection lens and a deflector system. The projection lens is situated and configured so as to form a charged particle beam passing through an illuminated region of the reticle and form an image of the illuminated region on a corresponding region of the substrate. The deflector system includes a first deflector set associated with an "image side" of the projection lens (side closer to the image formed by the projection lens), and a second deflector set associated with an "object side" of the projection lens (side closer to the object). Each of the first and second deflector sets comprises multiple deflectors. At least one deflector of the first set comprises an axial array of micro-deflectors each having a similar radial angular orientation as the respective deflector. Similarly, at least one deflector of the second set comprises an axial array of micro-deflectors each having a similar radial angular orientation as the respective deflector. Each micro-deflector of the first set is preferably independently and adjustably energizable such that the array of micro-deflectors of the first set collectively produces a deflection field similar to a deflection field that otherwise would be produced by the respective deflector in the first set. Similarly, each micro-deflector of the second set is preferably independently and adjustably energizable such that the array of micro-deflectors of the second set collectively produces a deflection field similar to a deflection field that otherwise would be produced by the respective deflector in the second set. The micro-deflectors preferably satisfy the expressions:

$$0.02 \leq R_1/K \leq 0.20$$

$$0.02 < R_2/K \leq 0.30$$

$$0.01 \leq L/K \leq 0.05$$

$$0.001 \leq S/K \leq 0.05$$

wherein $R_1$ is the inside radius of the micro-deflectors in a set, $R_2$ is the outside radius of the micro-deflectors in the set, L is the axial length of the micro-deflectors, S is the axial spacing between the micro-deflectors, and K is an axial distance between the reticle and the substrate.

According to yet another aspect of the invention, projection-optical systems for charged-particle-beam microlithography apparatus are provided. According to a representative embodiment, the apparatus comprises a projection lens and a deflector system. The projection lens is situated and configured to receive a charged particle beam passing through an illuminated region of the reticle and form an image of the illuminated region on a corresponding region of the substrate. The deflector system is associated with the projection lens and comprises a first and a second deflector set. The first set comprises multiple micro-deflectors linearly arrayed in an axial direction between the object surface and aperture surface of the projection lens, and the second set comprises multiple micro-deflectors linearly arrayed in an axial direction between the image surface and the aperture surface of the projection lens. The micro-deflectors preferably satisfy the expressions:

$$0.02 \leq R_1/K \leq 0.20$$

$$0.02 < R_2/K \leq 0.30$$

$$0.01 \leq L/K \leq 0.05$$

$$0.001 \leq S/K \leq 0.05$$

wherein $R_1$ is the inside radius of the micro-deflectors in a set, $R_2$ is the outside radius of the micro-deflectors in the set, L is the axial length of the micro-deflectors, S is the axial spacing between the micro-deflectors, and K is an axial distance between the reticle and the substrate.

According to yet another aspect of the invention, projection-optical systems are provided for charged-particle-beam microlithography apparatus. A representative embodiment comprises a projection lens and a deflector system. The projection lens is situated and configured as summarized above. The deflector system comprises first and second deflector sets. The first deflector set comprises three deflectors and is situated between the object and aperture surfaces of the projection lens. The second deflector set comprises three deflectors and is situated between the aperture and image surfaces of the projection lens. The first and second sets serve to impart respective corrections of off-axis third-order aberrations and on-axis third-order aberrations, wherein the correction of the off-axis aberrations is substantially equal to the correction of the on-axis aberrations. Each deflector in each of the first and second sets comprises respective multiple micro-deflectors linearly arrayed in an axial direction. Each micro-deflector preferably satisfies the expressions:

$$0.02 \leq R_1/K \leq 0.20$$

$$0.02 < R_2/K \leq 0.30$$

$$0.01 \leq L/K \leq 0.05$$

$$0.001 \leq S/K \leq 0.05$$

wherein $R_1$ is the inside radius of the micro-deflectors in the respective set, $R_2$ is the outside radius of the micro-deflectors in the set, L is the axial length of the micro-deflectors, S is the axial spacing between the micro-deflectors, and K is an axial distance between the reticle and the substrate.

By substituting an array of micro-deflectors for an aberration-correcting deflector in a deflector set, the inside radius and outside radius of the deflector system can be made smaller than practical when the deflector system comprises only deflectors. This allows downsizing of the overall microlithographic apparatus.

Also, by forming a deflection field using an array of micro-deflectors rather than a deflector, it is possible to more accurately adjust the electrical current supplied to the deflector group by independently adjusting the respective currents supplied to the individual micro-deflectors. This facilitates easier maintenance and alignment of the microlithographic apparatus The foregoing and additional features and advantages of the present invention will be more readily apparent from the following detailed description, which proceeds with reference to the accompanying drawings.

BRIEF DESCRIPTION OF THE DRAWINGS

FIGS. 4(a)–4(b) schematically depict certain details of the coils "a" of each of the deflectors in the FIG. 1 embodiment, wherein FIG. 4(a) is a side sectional view and FIG. 4(b) is an axial end view as viewed from the substrate.

FIGS. 7(a)–7(c) depict certain configurational aspects of the deflectors as used in the second representative embodiment, wherein FIG. 7(a) is an axial end view of the Y-direction deflector, FIG. 7(b) is an axial end view of the X-direction deflector, and FIG. 7(c) is a cross-sectional view along the line A–A' of FIG. 7(a).

FIG. 10 is a schematic optical diagram of a CPB optical system according to the fourth representative embodiment.

FIGS. 11(a)–11(b) depict, with respect to the fourth representative embodiment, sectional views of one of the deflectors $Db_1$–$Db_3$ before and after, respectively, changing $Rb_1$ to $Rb_1'$.

FIGS. 14(a)–14(c) schematically depict various aspects of a portion of a CPB projection-optical system according to a fifth representative embodiment, wherein FIG. 14(a) is a side elevational view of the micro-deflectors of the deflector group $Dg_2$, FIG. 14(b) is an axial end view of the deflection coils of the micro-deflectors for deflecting the charged particle beam in the Y-direction, and FIG. 14(c) is an axial end view of the deflection coils of the micro-deflectors for deflecting the charged particle beam in the X-direction.

DETAILED DESCRIPTION

The invention is described in connection with multiple representative embodiments.

First Representative Embodiment

Figure 1:
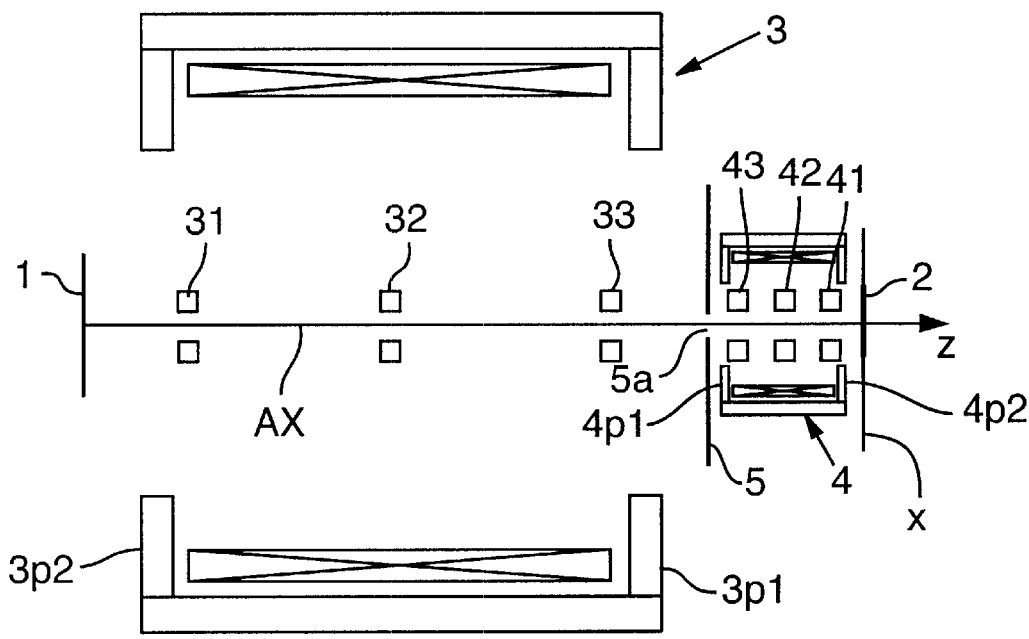
FIG. 1 is a schematic optical diagram of certain aspects of a CPB projection-optical system according to a first representative embodiment of the invention.

A first representative embodiment of an optical system for a CPB microlithography apparatus is schematically depicted in FIG. 1. The FIG. 1 system is specifically adapted for use with an electron beam as a representative charged particle beam. Also shown in FIG. 1 are a reticle 1, a substrate ("wafer") 2, a first projection lens 3 and a second projection lens 4, all arranged on an optical axis AX (extending along the Z axis). Both projection lenses 3, 4 are electromagnetic lenses. An aperture plate 5 is situated between the first and second projection lenses 3, 4 and defines an aperture 5a through which the electron beam passes as the beam propagates from the first to the second projection lens. The projection lenses 3, 4 in conjunction with the aperture 5a form a SMD lens configuration. The FIG. 1 embodiment also includes aberration-correcting deflectors 31–33 and 41–43. The deflectors 31–33 are associated with the first projection lens 3, and the deflectors 41–43 are associated with the second projection lens 4.

The magnetic field produced by the projection lenses 3, 4 satisfies a Symmetric Magnetic Doublet (SMD) condition with respect to the aperture 5a. By optimizing the positions and rotation angles of the deflectors 31–33 and 41–43, as well as the respective excitation currents applied to the deflectors 31–33 and 41–43, an electron beam propagating from an off-axis locus to a downstream locus also situated off-axis exhibits substantially no greater aberration than exhibited by an electron beam propagating along the optical axis AX.

By way of example, the "column length" (i.e., the axial distance from the surface of the reticle 1 to the surface of the substrate 2) is 570 mm, the beam half-angle is 2.6 mrad, the shaped beam size is 0.25 mm, and the maximum deflection position on the plane of the substrate surface is 2.375mm× 0.375 mm relative to the optical axis. ("Shaped-beam size" is sometimes termed the "subfield size" and is the area on the reticle that can be exposed in one shot. Chu et al., *Optik* 61:121, 1982.) The "negative Z-axis direction" extends leftward in the figure from the surface of the substrate 2. Hence, everything situated to the left of the substrate 2 in the figure has a negative Z-coordinate. Further by way of example, the acceleration voltage is 110 KV, and the energy spread of the beam is 6 eV. The Z-coordinate of the aperture plate 5 is −114 mm.

Figure 2:
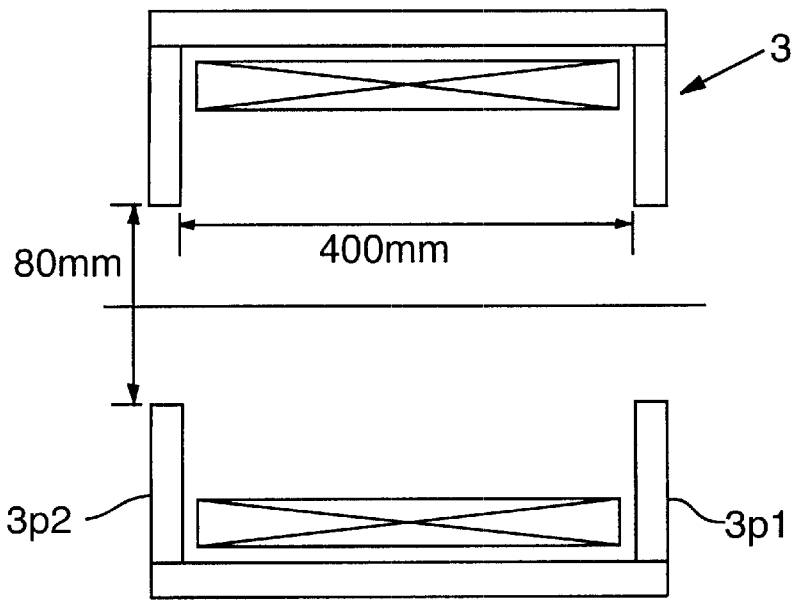
FIG. 2 shows certain dimensions of the first projection lens of the FIG. 1 embodiment.

FIG. 2 shows representative dimensions of the first projection lens 3, as well as magnetic poles 3p1, 3p2 of the first projection lens 3 for use especially whenever the size of the main field of the subject projection-optical system is relatively small. The axial distance between the magnetic poles 3p1, 3p2 is 400 mm, and the inside diameter of each of the poles 3p1, 3p2 is 80 mm. The distance between the magnetic poles 4p1, 4p2 of the second projection lens 4 is 100 mm, and the inside diameter of each of the magnetic poles 4p1, 4p2 is 20 mm. The respective excitation currents applied to the projection lenses 3, 4 are such that the projection lenses 3, 4 form a demagnifying optical system having, in this example, a demagnification ratio of 1/4.

Another coordinate system Z' can be introduced. The Z'-coordinate system has an origin 0' at the center of the aperture 5a. The orientation of the Z' axis is the same as the orientation of the Z axis. Hence, the first projection lens 3 produces a magnetic field having a magnetic flux density B(Z') on the optical axis that satisfies the following expression:

$$4B(-Z') \cong -B(Z'/4) \quad (1)$$

where Z'>0, and ≅ denotes an approximate equality.

Figure 3:
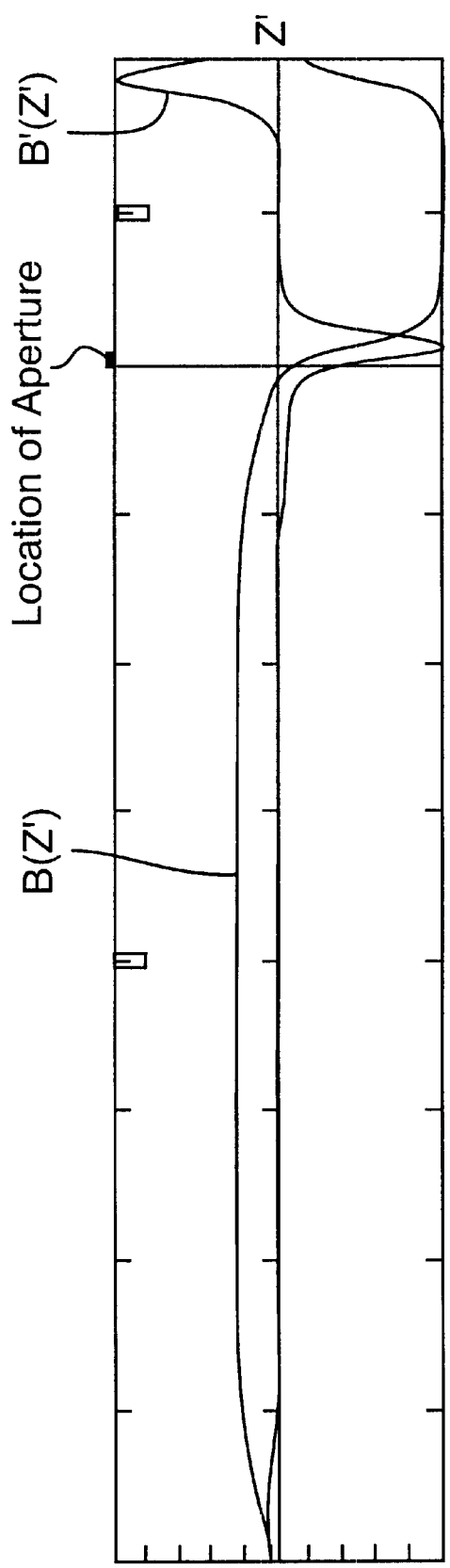
FIG. 3 is a plot of the lens field B(Z') generated by the first and second projection lenses of the FIG. 1 embodiment, and a plot of the first derivative B'(Z') of the lens field.

A plot of the lens field B(Z') is shown in FIG. 3, along with a plot of the first derivative B'(Z'). In this lens field, aberrations of the shaped beam are calculated according to aberration theory and set forth in Table 1 below. (The data in Table 1 are for third-order aberrations arising from the lenses. With respect to such aberrations, the larger the area to be exposed, the greater the aberration.)

TABLE 1

| Type of Aberration | Value |
|---|---|
| Spherical aberration | 1.37 nm |
| Shaped-beam coma | 2.33 nm |
| Field curature of shaped beam | 5.78 nm |
| Astigmatism of shaped beam | 2.59 nm |
| On-axis chromatic aberration | 9.36 nm |
| Chromatic aberration of shaped beam | 0.04 nm |
| Distortion of shaped beam | 0.01 nm |

In this example, the on-axis fifth-order aberration of the shaped beam was determined by additional calculations to be approximately zero. The "blur limit" of the lens field, which is defined as the square root of the sum of squares of the aberrations listed in Table 1 (excluding the distortion of the shaped beam), was determined to be 11.62 nm.

The actual blur cannot be reduced below the blur limit; thus, the blur limit is an intrinsic limiting property of the lens field formed by the projection lenses 3, 4. In an actual CPB optical system, any aberrations generated by deflections would be added to the blur limit. Although aberrations generated by deflection conventionally can be reduced by adjusting the deflection trajectory of the beam, such a technique is impractical because a large number of beam trajectories are required to project a reticle pattern onto a substrate. Other conventional methods for reducing deflection-generated aberrations are simply inadequate.

Figure 5:
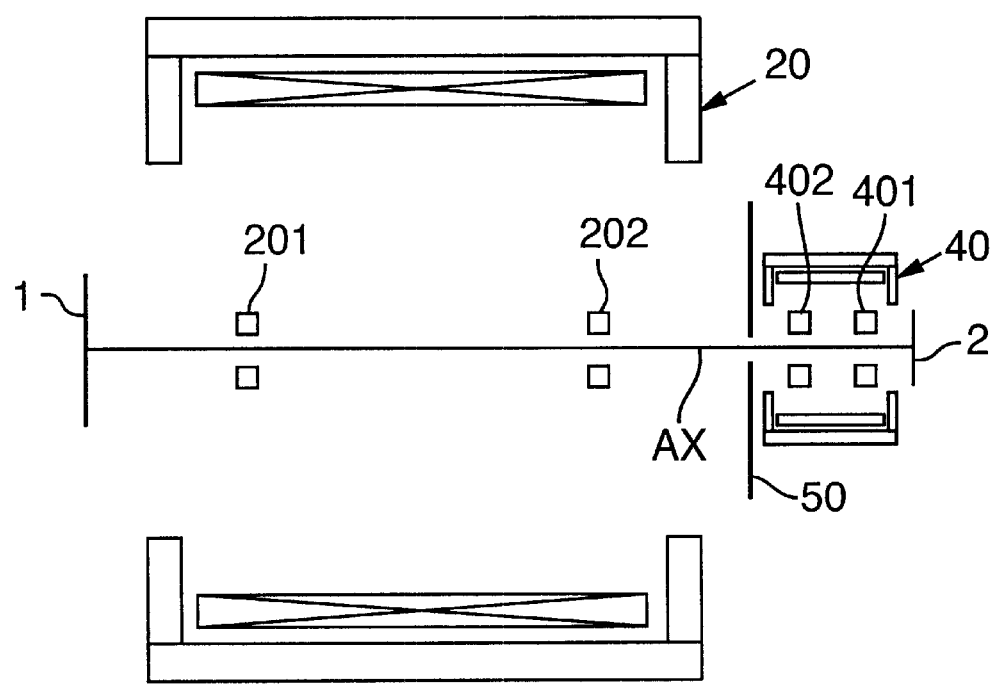
FIG. 5 is a schematic optical diagram of a conventional CPB projection-optical system, provided for comparison purposes with the FIG. 1 embodiment.

A representative conventional projection-optical system for a charged particle beam is shown in FIG. 5, which consists of a first projection lens 20, a second projection lens 40, and an intervening aperture plate 50 situated therebetween. Four deflectors 201, 202, 401, 402 are provided to correct certain aberrations. The deflectors 201, 202 are associated with the first projection lens 20, and the deflectors 401, 402 are associated with the second projection lens 40. The respective axial position and radial angular orientation of each of the deflectors 201, 202, 401, 402 are optimized as much as possible. Also optimized are the respective excitation currents supplied to the deflectors 201, 202, 401, 402. By way of example, the blur exhibited by the sum of the third-order aberrations of such an optical system is 34.14 nm. The projection lenses 20, 40 are similar to the corresponding projection lenses 3, 4 shown in FIG. 1.

In the FIG. 1 embodiment, third-order aberrations generated by deflection are reduced using the six deflectors 31–33, 41–43. The deflectors 31–33, 41–43 are identical (including identical size). The respective axial positions $Z_{31}$–$Z_{33}$ and $Z_{41}$–$Z_{43}$ and radial angular orientations of the deflectors 31–33, 41–43, as well as the respective electrical currents supplied to the deflectors 31–33, 41–43, are shown in Table 2, below:

TABLE 2

| Deflector | Z-coordinate (mm) | Excitation Current (A) | Ang. Orientation (Degrees) |
|---|---|---|---|
| 31 | −550 | −48.76 | −311.7 |
| 32 | −330 | 66.34 | −73.9 |
| 33 | −170 | 41.60 | −93.8 |
| 43 | −100 | 42.13 | −272.4 |

TABLE 2-continued

| Deflector | Z-coordinate (mm) | Excitation Current (A) | Ang. Orientation (Degrees) |
|---|---|---|---|
| 42 | −60 | −68.26 | −75.5 |
| 41 | −5 | 61.55 | −129.8 |

In Table 2, the respective angular orientation and electrical current supplied to the deflectors 31–33, 41–43 have been incrementally adjusted to obtain the listed optimal values of these parameters so as to minimize aberrations.

In Table 2, the respective positions $Z_{31}$–$Z_{33}$ and $Z_{41}$–$Z_{43}$ of the deflectors 31–33 and 41–43 are the respective Z-axis coordinates of the deflectors from an origin on the substrate 2. If the column length and demagnification of the projection-optical system are C and 1/M, respectively, then $Z_{31}$–$Z_{33}$ and $Z_{41}$–$Z_{43}$ satisfy the following set of equations:
Equation Set (2)

$$Z_{31} = -C - M(Z_{41})$$

$$Z_{32} = -C - M(Z_{42})$$

$$Z_{33} = -C - M(Z_{43})$$

Figure 4A:
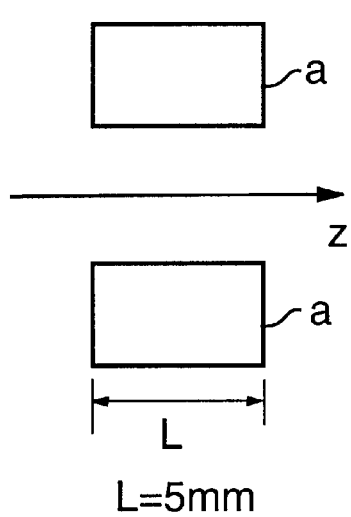
Figure 4B:
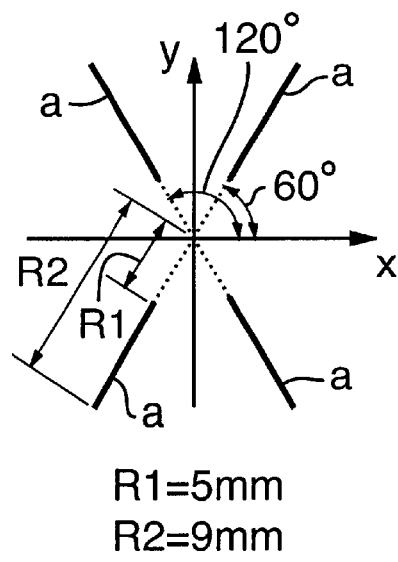

Each of the deflectors 31–33, 41–43 comprises an X-direction deflector and a Y-direction deflector. Each deflector 31–33, 41–43 has the same type of X-direction deflector and the same type of Y-direction deflector. Each X-direction deflector and each Y-direction deflector preferably comprises four coils. FIGS. 4(a)–4(b) show representative dimensions R1 (inside diameter), R2 (outside diameter), and L (axial length) of a coil "a" of a Y-direction deflector. FIG. 4(a) is a side view of the coil "a," and FIG. 4(b) is an axial end view of the coil "a" as viewed from the substrate 2. The electrical currents listed in Table 2 are the values of the respective electrical currents supplied to the coils "a" of the X-direction deflector of each of the respective deflectors 31–33, 41–43 to achieve a 1-mm deflection of the beam in the X-direction by the respective deflector 31–33, 41–43. Thus, whenever the beam is to be deflected in the X-axis direction by "A" mm, the respective electrical current to be supplied to the respective deflector is set to "A" times the corresponding value listed in Table 2.

In FIG. 4(b), four identical Y-direction-deflector coils "a" are shown for deflecting the beam in the Y-axis direction. The corresponding X-direction-deflector coils are not shown in this figure.

Both X-direction-deflector and Y-direction-deflector coils are provided with each deflector 31–33, 41–43 to enable the beam to be deflected in any desired direction in the X-Y plane by any of the deflectors 31–33, 41–43. Thus, if four identical Y-direction-deflector coils "a" are provided per deflector 31–33, 41–43 for Y-direction deflecting, then four identical X-direction-deflector coils "b" are also provided per deflector 31–33, 41–43 for deflecting the beam in the X-axis direction. The X-direction-deflector coils "b" are preferably oriented orthogonally (about the Z-axis) to the Y-direction-deflector coils "a". Also, with respect to each deflector 31–33, 41–43, the X-direction-deflector coils "b" have the same Z-axis coordinates as the Y-direction-deflector coils "a".

Figure 6:
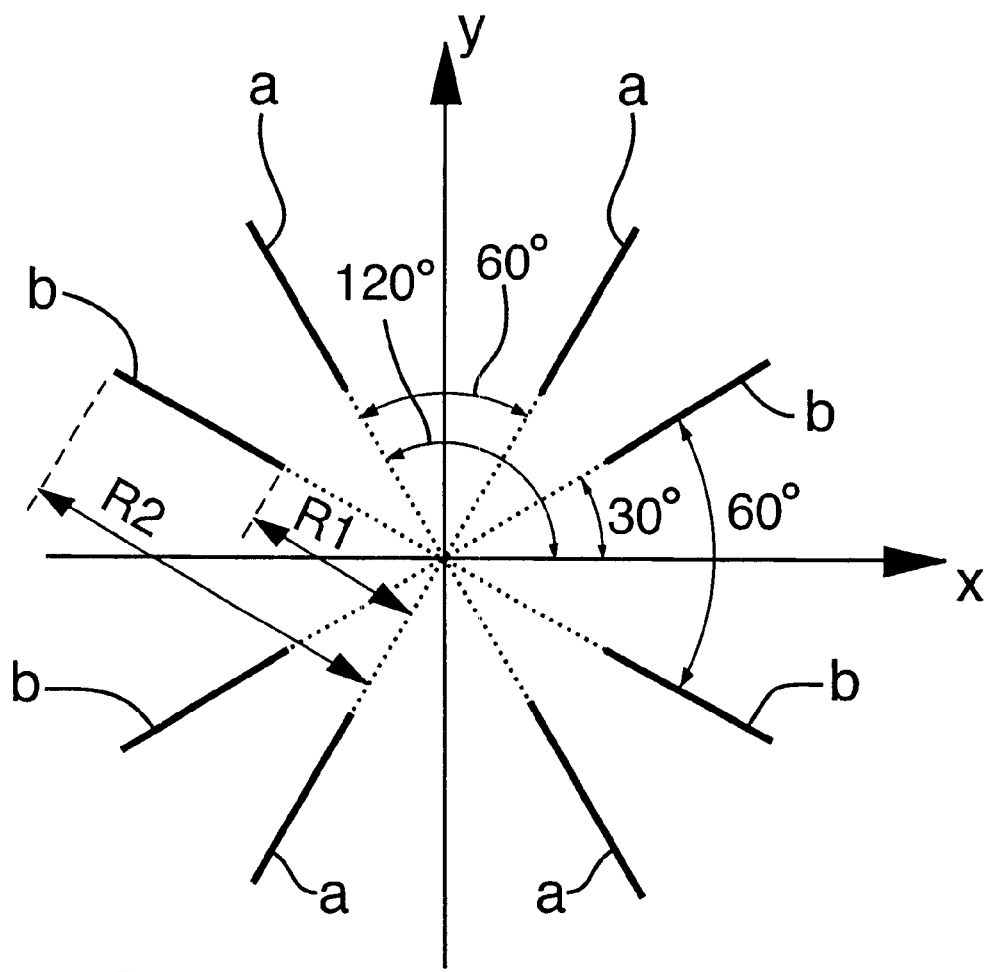
FIG. 6 is a schematic axial end view of the coils "a" of a Y-direction deflector and of the coils "b" of an X-direction deflector as used with each of the deflectors of the FIG. 1 embodiment.

FIG. 6 shows, with respect to any of the deflectors 31–33, 41–43, the four Y-direction-deflector coils "a" and the four X-direction-deflector coils "b". Hence, each of the deflectors 31–33, 41–43 shown in FIG. 1 comprises the four Y-direction-deflector coils "a" and the four X-direction- deflector coils "b". The values shown in Table 2 refer to a Y-direction-deflector coil "a" of any of the deflectors 31–33, 41–43. Corresponding values for the X-direction-deflector coils "b" of any of the deflectors 31–33, 41–43 would be identical to the stated values for the Y-direction-deflector coils "a", except that the radial angular orientation (about the Z-axis) of each of the X-direction-deflector coils "b" is displaced by 90 degrees from the radial angular orientation of the corresponding Y-direction-deflector coil "a". The Y-direction-deflector coils "a" for the deflectors 31–33 are the same size as the the Y-direction-deflector coils "a" for the deflectors 41–43.

By way of example, whenever the deflectors 31–33, 41–43 are configured in the manner described above, the deflection aberrations that could be corrected by dynamic correction (Zhu et al., *SPIE Proceedings* 2522:66, 1995) are as follows:

deflection coma: 4.44 nm
hybrid field curvature: 1.36 nm
hybrid astigmatism: 2.91 nm
deflection chromatic aberration: 3.33 nm
hybrid distortion: 9.82 nm Continuing with the example, by combining a blur limit of 11.62 nm generated by aberrations in the projection lenses 3, 4 with the blur generated by the deflection aberrations noted above, the blur due to all the third-order aberrations was calculated to be 13.27 nm. (See Chu et al., *Optik* 61:121, 1995, for underlying aberration theory of electron optics, by which theory the calculation was performed.) This value is small compared to the value (34.14 nm) exhibited by the conventional optical system shown in FIG. 5, and is very close to the on-axis blur (11.62 nm). (Note: "on-axis blur" has the same value as the "blur limit" since aberrations arising from deflection theoretically can be eliminated. However, in actual practice, it is very difficult to eliminate these aberrations completely.) Moreover, since an optimal configuration was obtained by incrementally changing the respective positions and orientations of each of the deflectors 31–33, 41–43 as required, the optimal configuration is stable, unlike the unstable configuration derived from a conventional multiple-deflection theory. Hosokawa, *Optik* 56:21, 1980.

The principles discussed above also can be applied to a projection-optical system employing immersion lenses. In such an instance, the blur is reduced below the blur achievable using conventional technology by installing six deflectors in the same manner as described above and by optimizing the radial angular orientation and excitation current of each of the six deflectors.

Second Representative Embodiment

Figure 7C:
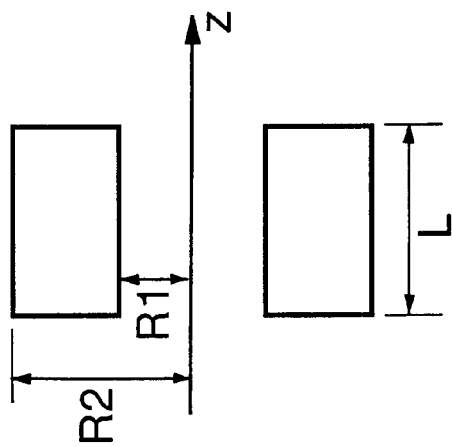
Figure 7B:
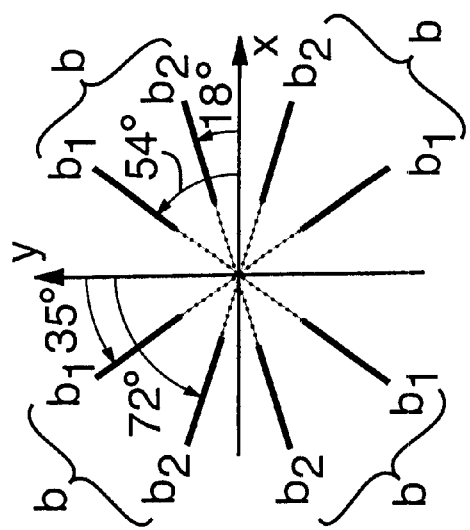
Figure 7A:
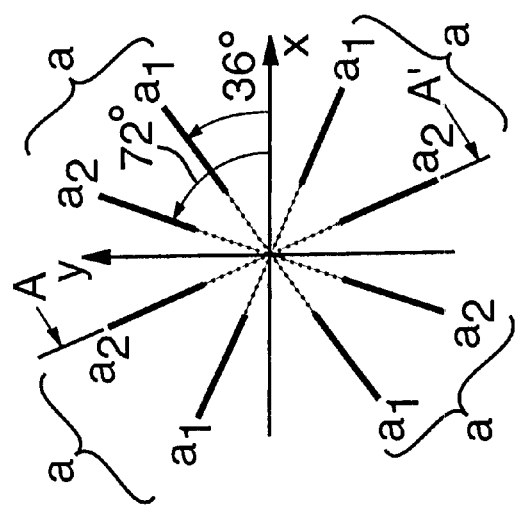

Whereas the First Representative Embodiment was directed to third-order aberrations, the Second Representative Embodiment is directed to fifth-order aberrations arising from the deflectors shown in FIGS. 4(b) and 6. To such end, the Y-direction-deflector coils "a" (comprising the coils "$a_1$", "$a_2$") and the X-direction-deflector coils "b" (comprising the coils "$b_1$", "$b_2$") as shown in FIGS. 7(a)–7(b) are employed for each of the deflectors 31–33, 41–43. By way of example, the ratio of electrical current supplied to the coils "$a_1$" and "$a_2$" is "$a_1$":"$a_2$"=1:1.61803389, and the ratio of electrical current supplied to the coils "$b_1$" and "$b_2$" is "$b_1$":"$b_2$"=1:1.61803389. These deflector coils are especially effective in eliminating certain fifth-order aberrations termed "4-fold aberrations."

As in the first embodiment, each of the six deflectors 31–33, 41–43 in the second embodiment is configured and situated to reduce third-order aberrations generated by the deflection of the beam. Each deflector 31–33, 41–43 has the same structure and comprises eight Y-direction-deflector coils "a" and eight X-direction-deflector coils "b". With respect to any of the deflectors 31–33, 41–43, FIG. 7(a) shows the radial angular orientation (about the Z-axis) of the Y-direction-deflector coils "$a_1$", "$a_2$", and FIG. 7(b) shows the radial angular orientation (about the Z-axis) of the X-direction-deflector coils "$b_1$" "$b_2$". A sectional view of FIG. 7(a) along the line A–A' is shown in FIG. 7(c). The X-direction-deflector coils "$b_1$", "$b_2$" shown in FIG. 7(b) are rotated by 90 degrees about the Z-axis with respect to the Y-direction-deflector coils "$a_1$", "$a_2$" shown in FIG. 7(a). For each deflector, the X-direction-deflector coils "$b_1$", "$b_2$" have the same Z-coordinate as the Y-direction-deflector coils "$a_1$", "$a_2$". In FIG. 7(c), R1=20 mm, R2=35 mm, and L=5 mm.

The charged particle beam can be deflected in any desired direction on the X-Y plane by changing the respective electrical currents supplied to the X-direction deflecting coils and to the Y-direction deflecting coils while preserving the selected ratio (see above for example) of the electrical currents supplied to the coils "$a_1$":"$a_2$" and "$a_1$":"$a_2$". It will be understood that any specific angles of the coils "$a_1$", "$a_2$", "$b_1$", "$b_2$" and electrical currents applied thereto as mentioned above are by way of example only and are not intended to be limiting in any way.

All the deflectors 31–33, 41–43 have the same relative structure as shown in FIGS. 7(a)–7(c). The deflectors 31–33 have the same dimensions, and the deflectors 41–43 have the same dimensions. Whereas FIG. 7(c) shows general dimensional relationships, the inside radius, outside radius, and length in the optical-axis direction of each of the deflectors 31–33 are more specifically denoted $R_{a1}$, $R_{a2}$, and $L_a$, respectively; and the inside radius, outside radius, and length in the optical-axis direction of each of the deflectors 41–43 are more specifically denoted $R_{b1}$, $R_{b2}$, and $L_b$, respectively. These dimensions preferably satisfy the following expressions:

Equation Set (3)

$$R_{a1}=M\times R_{b1}$$

$$R_{a2}=M\times R_{b2}$$

$$L_a=M\times L_b$$

where M represents the magnification power of the CPB projection-optical system.

An electron beam (as a representative charged particle beam) is shaped by an illumination-optical system (situated upstream of the reticle) to have a particular transverse profile and is usually incident on the reticle 1 off-axis. The image of the illuminated region of the reticle 1 is then projected onto the substrate 2 (e.g., semiconductor wafer) to imprint the reticle pattern on the substrate. By optimally energizing the six deflectors 31–33, 41–43, third-order and fifth-order aberrations of the image of the reticle formed off-axis on the substrate can be made approximately equal to any corresponding third-order and fifth-order aberrations, respectively, of the image of the reticle formed on-axis on the substrate.

Third Representative Embodiment

This embodiment is similar to the first embodiment except for dimensions of the first and second projection lenses. This embodiment is especially adapted to reduce fifth-order aberrations in addition to third-order aberrations, and is especially advantageous for use when the main field is large. (For comparison, in the First Representative Embodiment, the main field was 5 mm and the subfield size was 0.25 mm. In the present embodiment, the main field is larger than 5 mm.) A "main field" is a principal exposure unit of a die on the wafer, wherein the main field is typically divided into subfields or other suitable subdivisions of the main field. The larger the main field (wherein a large main field is desirable from the standpoint of higher throughput), the greater the lateral deflection of the beam that is necessary to reach the dimensional extremes of the main field, and the larger the aberrations.

Figure 8:
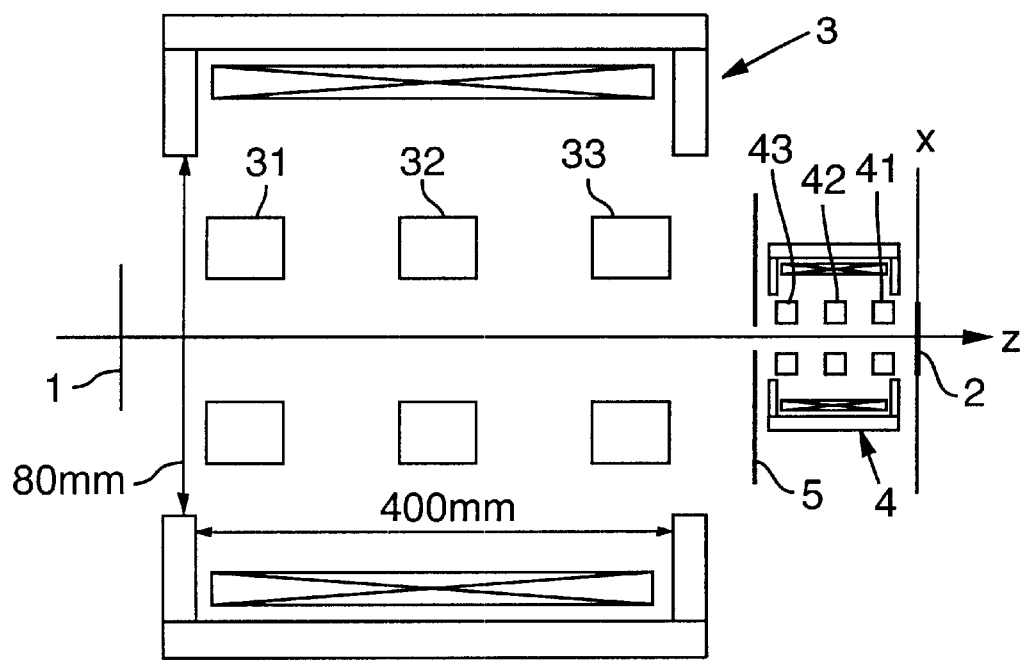
FIG. 8 is schematic optical diagram of a CPB optical system according to the third representative embodiment as used for a large main field.

The overall configuration of this embodiment is shown in FIG. 8, which schematically depicts a projection-optical system. By way of example, in the system shown in FIG. 8, the inside radius $R_{a1}$, outside radius $R_{a2}$, and length $L_a$ (along the optical axis) of each of the deflectors 31–33 are according to the following set of expressions:

Equation Set (4)

$$R_{a1}=Sf\times 20 \text{ mm}$$

$$R_{a2}=Sf\times 35 \text{ mm}$$

$$L_a=Sf\times 5 \text{ mm}$$

wherein 20 mm, 35 mm, and 5 mm are the corresponding dimensions of the deflectors 41–43, and Sf denotes the scale factor (see below). (The scale factor is a dimensional factor for dimensions of the deflectors 31–33 relative to corresponding dimensions of the deflectors 41–43. The scale factor can be equal to M in order to reduce deflection aberrations. However, sometimes the scale factor is limited by the prevailing mechanical configuration of the projection-optical system or for other reasons.) Also, the inside radius $R_{b1}$, outside radius $R_{b2}$, and length $L_b$ of each of the deflectors 41–43 are according to the following expressions:

Equation Set (5)

$$R_{b1}=20 \text{ mm}$$

$$R_{b2}=35 \text{ mm}$$

$$L_b=5 \text{ mm}$$

Figure 9:
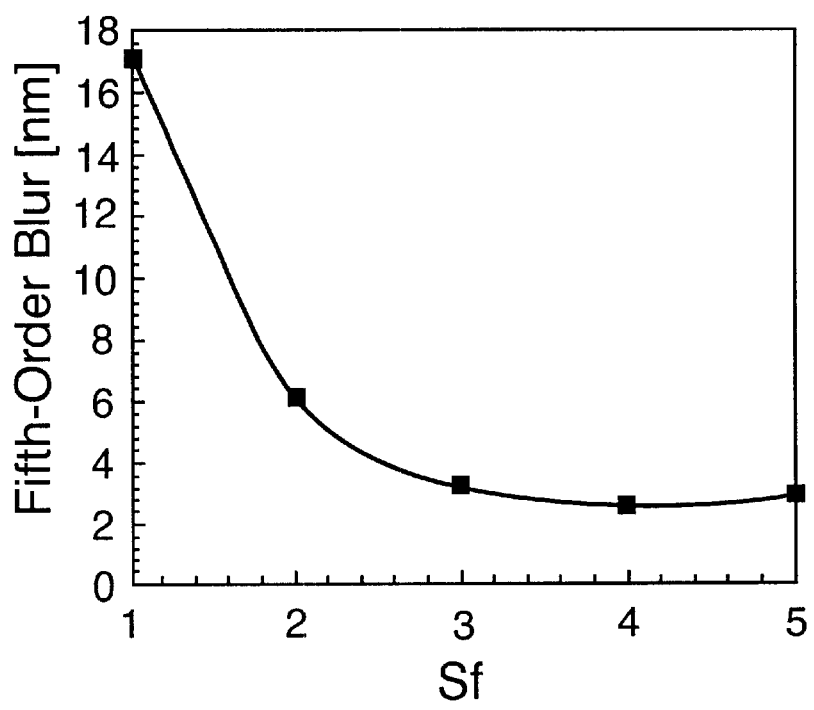
FIG. 9 is a plot, for the third representative embodiment, of the results of computing fifth-order aberration realized with changes in the scale factor Sf.

The scale factor Sf can be changed and used to calculate fifth-order aberrations and to obtain the resultant changes in fifth-order blur under various conditions. FIG. 9 shows a representative result of computing the fifth-order blur upon a change in the scale factor Sf. To obtain the data shown in FIG. 9, the axial position of each deflector 31–33, 41–43 was fixed. The excitation current and radial angular orientation of each of the deflectors 31–33, 41–43 were incrementally adjusted and optimized so as to reduce the deflection-induced third-order aberration approximately to zero whenever the scale factor Sf was changed.

In the optical system of the first embodiment (FIG. 1) the scale factor Sf=1. The fifth-order blur in such a case can be read from the plot of FIG. 9 at Sf=1. As Sf is increased gradually from 1, the fifth-order blur monotonically decreases until it reaches a minimum near Sf=4. Thus, the fifth-order blur at higher values of Sf can be made smaller than the fifth-order blur when Sf=1 (FIG. 1) by setting Sf=M whenever the demagnification factor is 1/M. In this instance, the fifth-order blur can be reduced to approximately 2.8 nm (FIG. 9).

Table 3 shows the Z-coordinate, excitation current, and radial angular orientation of the X-direction-deflectors of each of the deflectors 31–33, 41–43 whenever the deflectors 31–33, 41–43 are optimally placed, oriented, and energized. The radial angular orientation of each Y-direction-deflector of the deflectors 31–33, 41–43 is obtained by adding 90 degrees to the radial angular orientation of the corresponding X-direction-deflector of the respective deflectors 31–33, 41–43. The excitation currents shown in Table 3 are the values required when the deflectors 31–33, 41–43 deflect the electron beam in the X-direction by 1 mm.

TABLE 3

| Deflector | Z-coordinate (mm) | Excitation current (A) | Ang. Orientation (degrees) |
| --- | --- | --- | --- |
| 31 | −510.0000 | −359.3728 | −107.0914 |
| 32 | −410.0000 | 303.1895 | −85.9361 |
| 33 | −174.0000 | 183.9843 | −95.9469 |
| 43 | −99.0000 | 134.1613 | −270.3519 |
| 42 | −40.0000 | 336.9017 | −275.3231 |
| 41 | −15.0000 | 367.0115 | −113.0449 |

In this embodiment, the beam half-angle is 2.6 mrad, which is small. The beam half-angle is measured at the surface of the substrate. The beam half-angle is the angle, relative to a normal to the substrate surface at the point of incidence of the beam, of the edge of the cone of rays of the beam as convergent on the substrate surface at that point. The beam half-angle is also termed the "aperture half-angle" or "numerical aperture" (NA) of the beam. The normal range for the beam half-angle is 2–10 mrad. Also, the main field size on the surface of the microlithographic substrate (corresponding approximately to the maximum deflection position) is about 5 mm. Therefore, blur exhibited by a CPB projection-optical system can be reduced to an acceptable level by configuring the optical system as shown in FIG. 8.

Fourth Representative Embodiment

This embodiment is discussed below in connection with FIGS. 10–13. An overall schematic of a projection-optical system, for use in a CPB microlithography apparatus, according to this embodiment is shown in FIG. 10. In FIG. 10, components that are the same as in FIG. 8 have the same reference numerals, except that the deflectors 31–33, 41–43 in FIG. 8 have different reference designators $Da_1$, $Da_2$, $Da_3$, $Db_1$, $Db_2$, $Db_3$, respectively, in FIG. 10.

The FIG. 10 configuration reduces third-order and fifth-order aberrations to acceptably small values whenever the beam half-angle is, e.g., about 6 mrad and/or the main-field size is about, e.g., 10 mm. This is accomplished by changing the inside diameter of each of the deflectors $Da_1$, $Da_2$, $Da_3$, $Db_1$, $Db_2$, $Db_3$ (which are designed to reduce third-order deflection aberrations and fifth-order deflection aberrations to about zero and a sufficiently small value, respectively, for, e.g., performing 100-nm microlithography) while keeping the scale factor Sf constant at M.

In the FIG. 10 embodiment, by way of example, the axial distance between the magnetic poles 3p1, 3p2 of the first projection lens 3 is 280 mm, and the inside diameter of each of the magnetic poles 3p1, 3p2 of the first projection lens 3 is 200 mm. The second projection lens 4 is one-fourth the size of the first projection lens 3; consequently, the distance between the magnetic poles 4p1, 4p2 and the inside diameter of each of the magnetic poles 4p1, 4p2 of the second projection lens 4 are 70 mm and 50 mm, respectively. As in FIG. 8, the lens fields generated by the projection lenses 3, 4 of FIG. 10 satisfy the SMD condition. The respective excitation currents of the projection lenses 3, 4 of FIG. 10 are such that the respective lens fields will function collectively as a demagnifying optical system with a demagnification factor of 1/4. The optical system shown in FIG. 10 differs from the FIG. 8 embodiment in the manner in which the inside diameter of each of the deflectors $Da_1$–$Da_3$, $Db_1$–$Db_3$ is established.

Specifically, by way of example, in the FIG. 10 embodiment, the lens-column length is 400 mm, the beam half-angle is 6 mrad, the shaped beam size is an 0.25-mm angle, the maximum deflection position on the substrate is 4.875 mm×0.375 mm (corresponding to a 10-mm field), the acceleration voltage is 100 KV, the energy spread of the charged particle beam is 5 eV, and the Z-coordinate of the aperture 5 is Z=−80 mm. The optical axis is represented by the Z-axis having an origin on the surface of the substrate 2. The axial direction from the reticle 1 to the substrate 2 is regarded as the +Z direction.

With respect to the lens field of the FIG. 10 embodiment, the on-axis third-order aberrations of the shaped beam were calculated. The results are summarized in the following Table 4:

TABLE 4

| Type of Aberration | Value |
| --- | --- |
| Spherical aberration | 6.55 nm |
| Shaped-beam coma | 11.94 nm |
| Field curvature of shaped beam | 21.43 nm |
| Astigmatism of shaped beam | 8.26 nm |
| On-axis chromatic aberration | 13.59 nm |
| Chromatic aberration of shaped beam | 0.52 nm |
| Distortion of shaped beam | 0.10 nm |

The on-axis fifth-order aberration of the shaped beam was calculated to be about zero with this embodiment. The blur limit (i.e., square root of the sum of squares of the aberrations listed in Table 4) was 29.92 nm.

The configuration of the deflectors $Da_1$–$Da_3$, $Db_1$–$Db_3$ is as follows. The respective deflectors for each projection lens 3, 4 are identical. As stated above, when the demagnification factor is 1/M, it has been discovered that fifth-order aberration is minimized whenever the parameters $R_{a1}$ (inside radius), $R_{a2}$ (outside radius), and $L_a$ (length along optical axis) of each of the deflectors $Da_1$–$Da_3$ are M times the corresponding parameters $R_{b1}$, $R_{b2}$, and $L_b$ of each of the deflectors $Db_1$–$Db_3$. Further with respect to this example, the parameters $R_{b1}$, $R_{b2}$, and $L_b$ of each of the deflectors $Db_1$–$Db_3$ are set in accordance with the following set of equations. (The deflectors $Da_1$–$Da_3$, $Db_1$–$Db_3$ of the optical system of FIG. 10 have the same configuration as the deflectors 31–33, 41–43 shown in FIGS. 7(a–7(c).)

Equation Set (6)

$$R_{b2} = R_{b1} + 10$$

$$L_b = 8$$

$$R_{a1} = 4(R_{b1})$$

$$R_{a2} = 4(R_{b2})$$

$$L_a = 4(L_b) = 32$$

where the units are mm. That is, the scale factor is Sf=4 so that fifth-order aberrations will be minimized.

The Z-coordinates of the deflectors $Da_1$–$Da_3$, $Db_1$–$Db_3$ (i.e., the respective distances from the surface of the substrate 2 to each of the deflectors) are denoted by $u_1$, $u_2$, $u_3$, $v_1$, $v_2$, and $v_3$, respectively. The distance between the reticle 1 and the substrate 2 is denoted by d. The Z-coordinates $u_1-u_3$, $v_1-v_3$ of the deflectors $Da_1-Da_3$, $Db_1-Db_3$, respectively, are established in accordance with the following equation.

$$u_j = d - (m \times v_j) \qquad (7)$$

where j=1, 2, 3. The distance between the substrate 2 and the aperture plate 5 is 80 mm=d/(M+1). Also, the respective distances from the aperture plate 5 to the deflectors $Da_1-Da_3$, $Db_1-Db_3$ can be designated by $A_{a1}-A_{a3}$, $A_{b1}-A_{b3}$, respectively. Hence, Equation (7) can be transformed into the following set of equations:

Equation Set (8)

$$u_j - d/(M+1) + d/(M+1) = d - M[d/(M+1)] + M[[d/(M+1)] - v_j]$$

$$A_{aj} + d/(M+1) = d/(M+1) + M(A_{bj})$$

$$A_{aj} = M(A_{bj})$$

In view of the above, the deflectors $Da_j$ and $Db_j$ (j=1, 2, 3) are situated such that the distance from the aperture plate 5 to a deflector $Da_j$ is M times larger than the distance from the aperture plate 5 to a corresponding deflector $Db_j$.

Next, while keeping unchanged the relations defined by Equation Set (6) (i.e., while keeping constant the scale factor Sf=4 between the set of deflectors $Da_1-Da_3$ and the set of deflectors $Db_1-Db_3$), $R_{b1}$ in Equation Set (6) can be changed to $R_{a1}$, to examine any resultant change in blur. FIG. 11(a) shows a cross-sectional view of the deflectors $Db_1-Db_3$ before $R_{b1}$ is changed. FIG. 11(b) shows a cross-sectional view of the deflectors $Db_1-Db_3$ after changing $R_{b1}$ to $R_{b1'}$. As shown in FIG. 11(a), the length in the Z-axis direction and the size in the radial direction of each of the coils constituting each of the deflectors are $L_b$ and $H_b$ ($=R_{b2}-R_{b1}$), respectively. Here, $2R_{b1}$ and $2R_{b2}$ are termed the "inside diameter" and "outside diameter", respectively, of the deflector. It follows from Equation Set (6) that the inside diameter $2R_{a1}$ of each of the deflectors $Da_1-Da_3$ is also changed to $2R_{a1'}$ whenever the inside radius $R_{b1}$ is changed to $R_{b1'}$. In such an instance, the dimensions of the coil ($H_b$, $L_b$) remain constant.

Whenever the inside radius $R_{b1}$ of any of the deflectors $Da_1-Da_3$ and $Db_1-Db_3$ is changed, each of the deflectors $Da_1-Da_3$ and $Db_1-Db_3$ is preferably adjusted by optimizing its respective excitation current and radial angular orientation so as to reduce the deflection-induced third-order blur as close as possible to zero.

Figure 12:
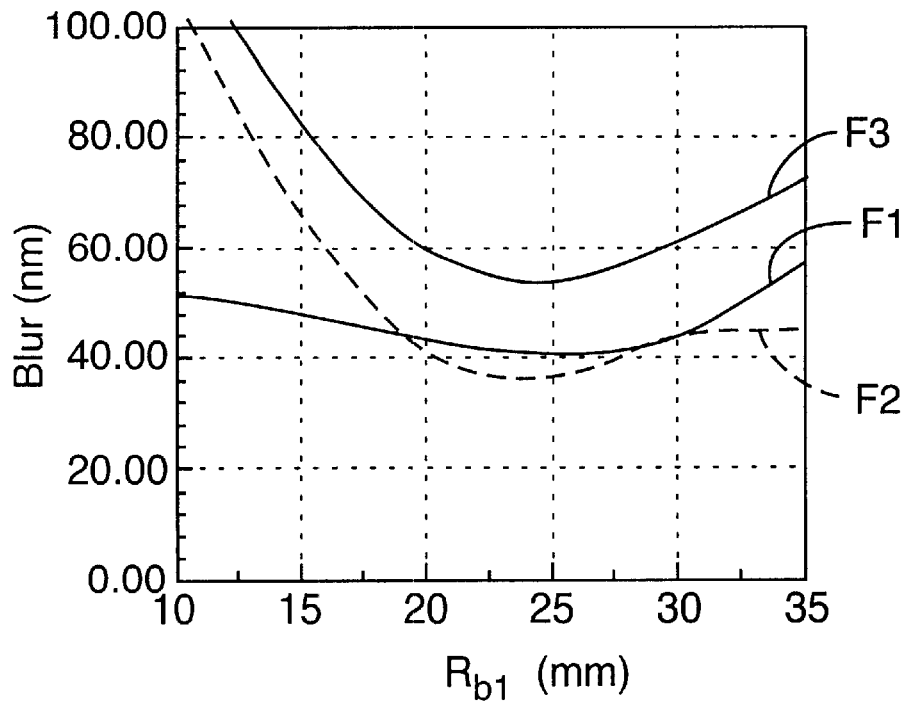
FIG. 12 includes, with respect to the fourth representative embodiment, exemplary plots of the third-order aberration (curve F1), fifth-order aberration (curve F2), and the square root of the sum of the squares of the third-order blur and fifth-order blur (curve F3) as $Rb_1$ is changed from 10 mm to 35 mm.

FIG. 12 shows the third-order blur (curve F1), fifth-order blur (curve F2), and the square root of the sum of squares of the third-order blur and fifth-order blur (curve F3) when $R_{b1}$ is changed from 10 mm to 35 mm. Here, the on-axis third-order blur, the on-axis fifth-order blur, the deflection-induced (off-axis) third-order blur, and the deflection-induced (off-axis) fifth-order blur are calculated. However, since the on-axis fifth-order blur and the deflection-induced third-order blur are approximately zero, the major contributors to the aberrations shown in FIG. 12 are on-axis third-order blur and deflection-induced fifth-order blur. It can be seen from curve F3 that the square root of the sum of squares of the third-order blur and fifth-order blur has a minimum near $R_{b1}$=25 mm. That is, the fifth-order blur can be minimized by designating $R_{a1}$=100, $R_{a2}$=140, and $L_a$=32 for the deflectors $Da_1-Da_3$ and $R_{b1}$=25, $R_{b2}$=35, and $L_b$=8 for the deflectors $Db_1-Db_3$.

The following Table 5 lists the respective Z-coordinates, excitation currents, and radial angular orientations of the X-direction deflectors of each of the deflectors $Da_1-Da_3$ and $Db_1-Db_3$, respectively, whenever the square root of the sum of squares of the third-order blur and fifth-order blur are minimized.

TABLE 5

| Deflector | Z-coordinate (mm) | Excitation current (A) | Ang. Orientation (degrees) |
|---|---|---|---|
| $Da_1$ | −356.0000 | −988.9408 | −86.1279 |
| $Da_2$ | −304.0000 | 817.3183 | 104.4209 |
| $Da_3$ | −120.0000 | 571.9032 | −91.5661 |
| $Db_3$ | −70.0000 | 322.6211 | −261.4625 |
| $Db_2$ | −24.0000 | 1048.6579 | −286.9695 |
| $Db_1$ | −11.0000 | 1114.1377 | −118.9335 |

The radial angular orientation of the Y-direction deflectors of each of the deflectors $Da_1-Da_3$, $Db_1-Db_3$ is obtained by adding 90 degrees to the radial angular orientation of the corresponding X-direction deflectors of each of the deflectors $Da_1-Da_3$, $Db_1-Db_3$. The excitation currents shown in Table 5 are the values required when each of the X-direction deflectors deflects the electron beam in the X-direction by 1 mm.

Moreover, it has also been discovered that, when the deflector $Da_3$ is made smaller than either of the deflectors $Da_1$, $Da_2$, and the deflector $Db_3$ is made smaller than either of the deflectors $Db_1$, $Db_2$ (while not changing the relations defined by Equation Set (8)), the hybrid third-order distortion, which is normally impossible to correct, decreases. For example, denoting by Sf' the scale factor of the deflector $Da_3$ relative to the deflectors $Da_1$, $Da_2$ (in this case, the scale factor of the deflector $Db_3$ relative to the deflectors $Db_1$, $Db_2$ also becomes Sf'), one obtains the relations:

(size of deflector $Da_3$) = Sf' × (size of deflector $Da_1$)

= Sf' × (size of deflector $Da_2$)

Figure 13:
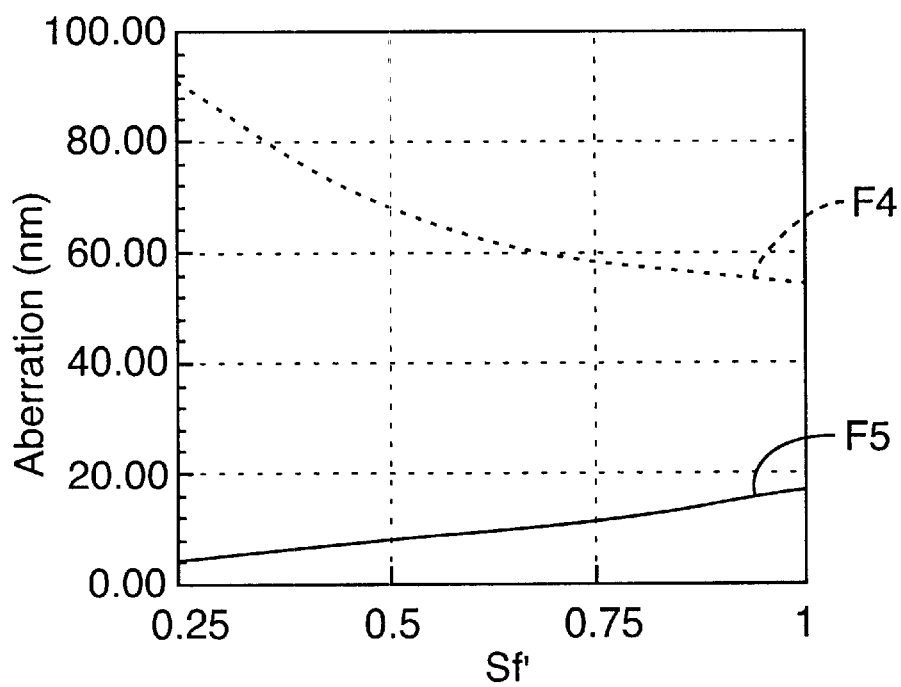
FIG. 13 includes, with respect to the fourth representative embodiment, exemplary plots of third-order subfield distortion (curve F4) and the square root of the sum of the squares of the third-order blur and fifth-order blur (curve F5), as the scale factor Sf is varied over the range 0.25 to 1.

FIG. 13 shows changes in the hybrid third-order distortion (curve F4) and the square root of the sum of squares of the third-order aberration and fifth-order aberration (curve F5), respectively, when the scale factor Sf' is varied over the range 0.25 to 1. As FIG. 13 shows, as Sf is increased from 0.25 to 1, the square root of the sum of squares of the third-order aberration and fifth-order aberration (curve F5) monotonically increases; however, the hybrid third-order distortion (curve F4) monotonically decreases. It follows from this observation that the blur of the image and the distortion of the image offset each other. Therefore, over the range of 0.25 to 1, it is preferable to: (a) set Sf'=0.25 to maximize the resolution, and (b) set Sf'=1 to minimize distortion.

In the explanation above, the deflectors $Da_1-Da_3$ were the same size or the deflectors $Da_1-Da_2$ were the same size. However, in this embodiment, the sizes of the deflectors $Da_1-Da_3$ and $Db_1-Db_3$ can be changed so long as the following relationships prevail:

Equation Set (9)

(size of $Da_1$) ≅ M(size of $Db_1$)

(size of $Da_2$) ≅ M(size of $Db_2$)

(size of $Da_3$) ≅ M(size of $Db_3$)

wherein 1/M is the demagnification ratio.

The principles of this embodiment are also applicable to CPB optical systems in which immersion lenses are used. Also, in this embodiment, six deflectors are used. However, this embodiment encompasses CPB optical systems comprising, more generally, at least four deflectors.

Fifth Representative Embodiment

Figure 14:
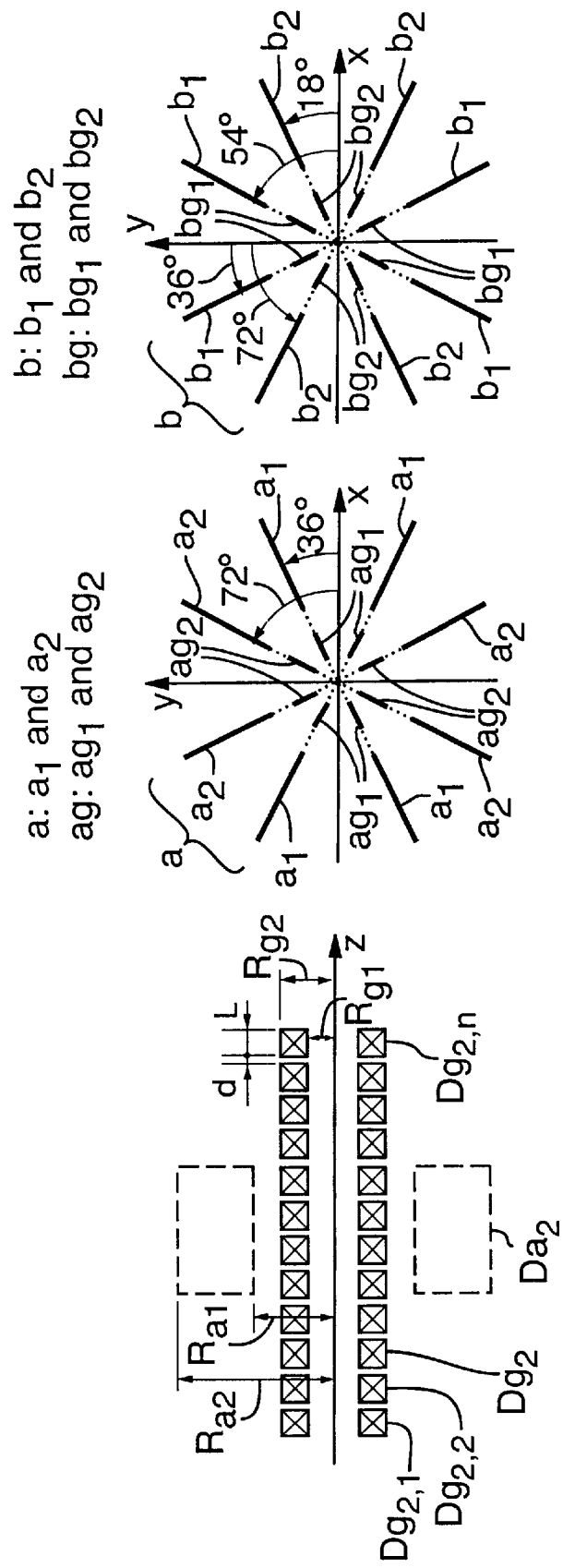

In this embodiment, each of the deflectors $Da_1$–$Da_3$ shown in FIG. 10 is replaced with a respective deflector group comprising multiple "micro-deflectors", and each of the deflectors $Db_1$–$Db_3$ is replaced with a respective deflector group comprising multiple "micro-deflectors." For example, reference is made to FIG. 14(a) which shows, for comparison purposes, the position of the representative deflector $Da_2$. In this embodiment, the deflector $Da_2$ is replaced by a respective deflector group $Dg_2$ that comprises "n" micro-deflectors $Dg_{2,1}$, $Dg_{2,2}$, ..., $Dg_{2,n}$ (where n is an integer that is as large as possible but normally 12 or less, as restricted by fabrication accuracy). Each of the "n" micro-deflectors $Dg_{2,1}$–$Dg_{2,n}$ is identical in shape and dimensions. All the "n" micro-deflectors $Dg_{2,1}$–$Dg_{2,n}$ have the same radial angular orientation as had the deflector $Da_2$. Similarly, all the "n" micro-deflectors of each of the deflector groups $Dg_1$, $Dg_3$ replacing the deflectors $Da_1$, $Da_3$, respectively, have the same radial angular orientation as had the respective deflectors $Da_1$, $Da_3$.

FIG. 14(b) and FIG. 14(c) are axial end views of the deflectors $Da_2$ and $Dg_{2,j}$. FIG. 14(b) also shows the Y-direction deflectors. FIG. 14(c) also shows the X-direction deflectors. In FIGS. 14(b) and 14(c), "a" and "b" denote the Y-direction deflector and X-direction deflector coils, respectively, of the deflector $Da_2$, and "ag" and "bg" denote the Y-direction deflector and X-direction deflector coils, respectively, of the micro-deflectors $Dg_{2,1}$–$Dg_{2,n}$.

In this embodiment, the coils "a" now constitute the coils "$a_1$" and "$a_2$", the coils "b" now constitute the coils "$b_1$" and "$b_2$", the coils "ag" now constitute the coils "$ag_1$" and "$ag_2$", and the coils "bg" now constitute the coils "$bg_1$" and "$bg_2$". As can be seen in FIGS. 14(b)–14(c), all the coils of the micro-deflectors $Dg_{2,1}$–$Dg_{2,n}$ are at the same radial angular orientation (about the Z-axis) as corresponding coils of the deflector $Da_2$.

By way of example, the ratios of the electrical currents applied to the coils $a_1$, $a_2$, $b_1$, $b_2$, $ag_1$, $ag_2$, $bg_1$, $bg_2$ are $a_1:a_2=b_1:b_2=ag_1:ag_2=bg_1:bg_2=1:1.61803389$.

The outside radius $R_{g2}$ of each of the micro-deflectors $Dg_{2,1}$–$D_{g2,n}$ of the deflector group $Dg_2$ is smaller (preferably 2 to 3 times smaller) than the outside radius $R_{a2}$ of the deflector $Da_2$ to reduce the deflection current of the deflectors $Dg_{2,1}$–$Dg_{2,n}$. Moreover, the outside radius $R_{g2}$, inside radius $R_{g1}$, optical-axis-direction length L of each of the micro-deflectors $Dg_{2,1}$–$Dg_{2,n}$ of the deflector group $Dg_2$, and the distance "d" between adjacent micro-deflectors $Dg_{2,1}$–$Dg_{2,n}$ preferably satisfy the following inequalities:

$$0.001 \leq d/K \leq 0.05 \quad (10)$$

$$0.02 \leq R_{g1}/K \leq 0.20 \quad (11)$$

$$0.02 < R_{g2}/K \leq 0.30 \quad (12)$$

$$0.01 \leq L/K \leq 0.05 \quad (13)$$

where K denotes the lens-column length (the axial distance between the "object surface," or surface of the reticle, and the "image surface," or surface of the substrate).

Figure 15:
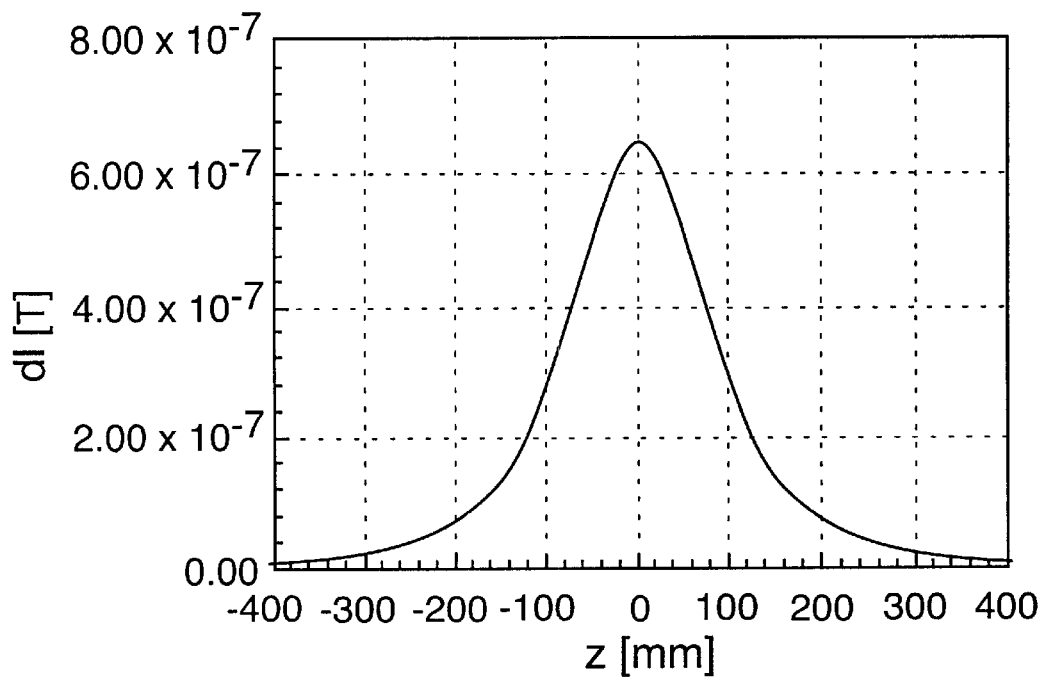
FIG. 15 shows, with respect to the fifth representative embodiment, an exemplary plot of the distribution of the deflection field formed by the deflector $Da_2$.

The electrical currents supplied to the micro-deflectors $Dg_{2,1}$–$Dg_{2,n}$ can be set independently of each other. FIG. 15 shows an exemplary distribution of a deflection field formed by a representative deflector $Da_2$. In the present embodiment, the electrical currents supplied to the micro-deflectors $Dg_{2,1}$–$Dg_{2,n}$ are set such that the resultant deflection field created by superposing the deflection fields generated by all the micro-deflectors $Dg_{2,1}$–$Dg_{2,n}$ is identical to the deflection field shown in FIG. 15. In FIG. 15, "d1" in the ordinate denotes the intensity of the deflection field on the optical axis, and coordinates in the direction of the optical axis (Z-axis) are plotted on the abscissa. The axial position of the center of the deflector $Da_2$ is regarded as the origin.

In this embodiment, not only is the deflector $Da_2$ replaced with the corresponding deflector group $Dg_2$, but also the other deflectors $Da_1$, $Da_3$, and $Db_1$–$Db_3$ are replaced with corresponding respective deflector groups $Dg_1$ (comprising micro-deflectors $Dg_{1,1}$–$Dg_{1,n}$), $Dg_3$ (comprising micro-deflectors $Dg_{3,1}$–$Dg_{3,n}$), $Dh_1$ (comprising micro-deflectors $Dh_{1,1}$–$Dh_{1,n}$), $Dh_2$ (comprising micro-deflectors $Dh_{2,1}$–$Dh_{2,n}$), and $Dh3$ (comprising micro-deflectors $Dh_{3,1}$–$Dh_{3,n}$). (These other deflectors are not shown in the figure.) With respect to each of the micro-deflectors of the deflector groups $Dg_1$, $Dg_3$, and $Dh_1$–$Dh_3$, the respective excitation currents are set such that the respective resultant deflection field created by the individual fields generated by all the constituent micro-deflectors is the same as the deflection field that would be generated by the corresponding deflectors $Da_1$, $Da_3$, and $Db_1$–$Db_3$. Upon making the deflection field of each of the deflector groups $Dg_1$–$Dg_3$, and $Dh_1$–$Dh_3$ the same as the deflection field that would otherwise be generated by the corresponding one of the deflectors $Da_1$–$Da_3$ and $Db_1$–$Db_3$, each of the deflector groups $Dg_1$–$Dg_3$, and $Dh_1$–$Dh_3$ is adjusted so that the total deflection field formed by all the deflector groups $Dg_1$–$Dg_3$ and $Dh_1$–$Dh3$ meets design specifications. In other words, the respective excitation current applied to each deflector group is adjusted while keeping constant the ratio of respective excitation currents applied to micro-deflectors within each deflector group. In addition, the respective radial angular orientation (about the Z-axis) of each of the deflector groups can be adjusted as required without changing the relative radial angular orientations of the micro-deflectors within each deflector group.

This embodiment has certain advantages. In other embodiments, if "N" larger deflectors were used, the overall CPB microlithography system would be very large and heavy. By reducing the radius of deflectors, it is possible to reduce the radius of the respective lenses, thereby simplifying system construction and maintenance. Also, the second deflection current is much smaller than using "N" larger deflectors.

More specifically, aberrations can be unchanged since the resultant deflection field formed by the optical system is identical to the deflection field that would otherwise be formed by the other embodiments that employ deflectors rather than deflector groups. The inside radius $R_{g1}$ and outside radius $R_{g2}$ of the deflector group $Dg_2$ can be decreased since the deflection field having a wide distribution in the direction of the optical axis that had been formed by the large deflector $Da_2$ is now formed by multiple micro-deflectors $Dg_{2,1}$–$Dg_{2,n}$.

Since the inside radius $R_{g1}$ and outside radius $R_{g2}$ of the deflector group $Dg_2$ can be decreased without degrading optical characteristics such as blur, distortion, and the like, the outside radii of the respective projection lenses 3 and 4 can be decreased. (Generally, the radius of the lens would be shortened proportionately to the decreased inside radii.) Hence, the exposure apparatus can be downsized.

Moreover, since in this embodiment single large deflectors (e.g., $Da_2$) are replaced with respective sets of multiple micro-deflectors $Dg_{2,1}$–$Dg_{2,n}$, the degree of freedom of the system increases significantly. This allows more accurate and precise adjustments of the respective excitation currents. For example, if an assembly error occurs during installation of the deflector groups, such errors can be eliminated by compensating adjustments of the respective excitation currents applied to the constituent micro-deflectors of each of the deflector groups. Hence, system maintenance and calibration are facilitated.

In the present embodiment, the micro-deflectors $Dg_{2,1}$–$Dg_{2,n}$ of each deflector group $Dg_1$–$Dg_3$, respectively, are preferably identical in size and shape. However, each deflector group can comprise micro-deflectors that are different in size and shape, so long as the deflection field of the corresponding deflector $Da_1$–$Da_3$, respectively, can be reproduced using the set of micro-deflectors. Moreover, the configuration of each of the micro-deflectors used in the present embodiment facilitates elimination of fifth-order 4-fold aberrations (Chu et al., *Optik* 61:121, 1982). (A representative micro-deflector size has an outside radius, relative to the optical axis, of 60 mm, an inside radius of 50 mm, an axial length of 8 mm, and an axial spacing between adjacent micro-deflectors of 1 mm.) However, micro-deflectors having any of various other configurations may be used if they adequately facilitate reduction of fifth-order aberrations.

Sixth Representative Embodiment

Figure 16:
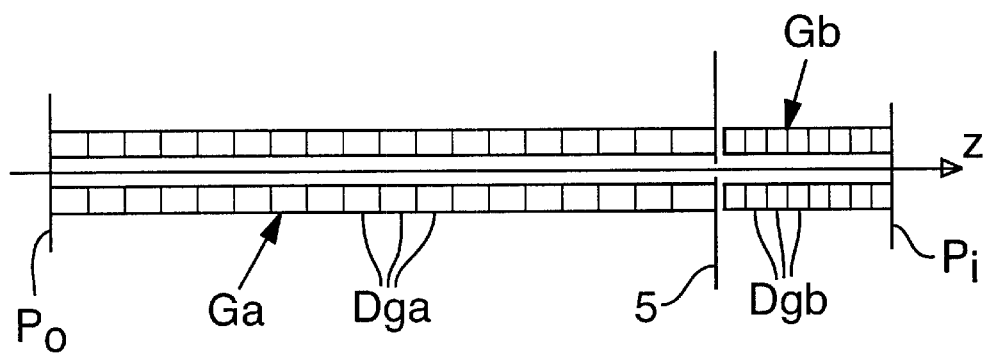
FIG. 16 is a schematic side elevational view showing certain aspects of a portion of a CPB projection-optical system according to a sixth representative embodiment of the present invention.

In the fifth representative embodiment described above, the deflectors $Da_1$–$Da_3$ and $Db_1$–$Db_3$ were replaced with corresponding deflector groups comprising micro-deflectors. In the present embodiment, the deflectors $Da_1$–$Da_3$ situated closer to the reticle in the FIG. 10 embodiment are replaced with a single deflector group, and the deflectors $Db_1$–$Db_3$ situated closer to the substrate in the FIG. 10 embodiment are replaced with a separate single deflector group. These deflector groups are shown in FIG. 16, depicting a first deflector group Ga comprising multiple micro-deflectors Dga situated between an object surface $P_o$ and the aperture plate 5 and a second deflector group Gb comprising multiple micro-deflectors Dgb situated between an image surface $P_i$ and the aperture plate 5. The inside radius, outside radius, and axial length of each of the micro-deflectors Dga, as well as the axial spacing between individual micro-deflectors Dga, are the same as in the fifth embodiment. Similarly, the inside radius, outside radius, and axial length of each of the micro-deflectors Dgb, as well as the axial spacing between individual micro-deflectors Dgb, are the same as in the fifth embodiment.

Figure 17:
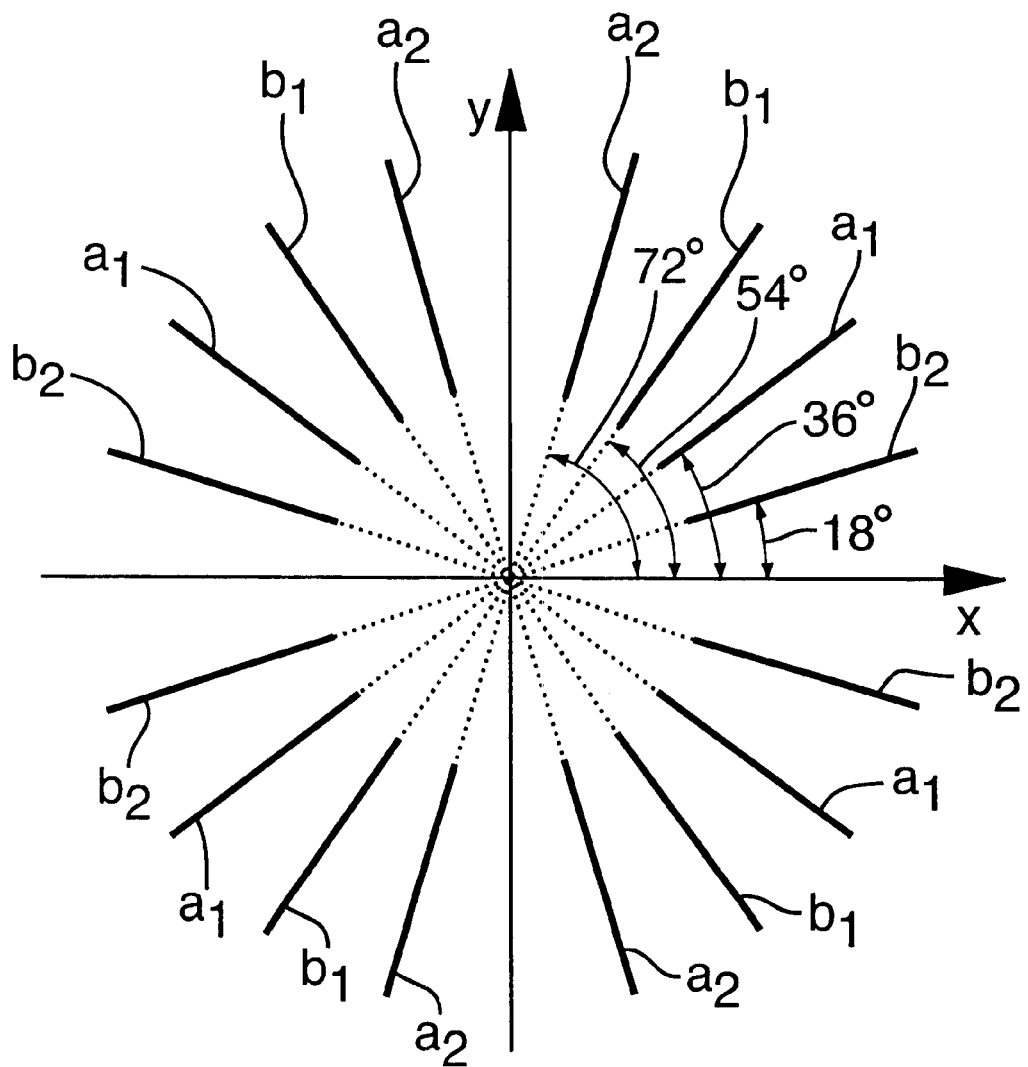
FIG. 17 is a schematic axial end view of the micro-deflectors Dga and Dgb of the sixth representative embodiment.

FIG. 17 depicts an axial end view of the deflector coils of either of the micro-deflectors Dga and Dgb (both have the same angular structure, but differ in their inside radii and outside radii). The cross-sectional structure of each of the micro-deflectors Dga, Dgb is the same as of the corresponding micro-deflectors $Dg_{2,1}$–$Dg_{2,n}$ of the fifth embodiment. In FIG. 17, deflector coils $b_1$ and $b_2$ are identical to corresponding deflector coils $a_1$ and $a_2$, except that the deflector coils $b_1$ and $b_2$ are angularly displaced about the Z-axis by 90 degrees relative to the deflector coils $a_1$ and $a_2$. Each of these deflector coils can be energized independently of the others. The ratio of electrical current supplied to the deflector coil $a_1$ to the electrical current supplied to the deflector coil $a_2$ is preferably maintained constant. The ratio of the electrical current supplied to the deflector coil $b_1$ to the electrical current supplied to the deflector coil $b_2$ is also preferably maintained constant. Moreover, as in the fifth embodiment, the radial angular orientations of the micro-deflectors Dga of the deflector group Ga are all equal, and the radial angular orientations of the micro-deflectors Dgb of the deflector group Gb also preferably are all equal.

Figure 18:
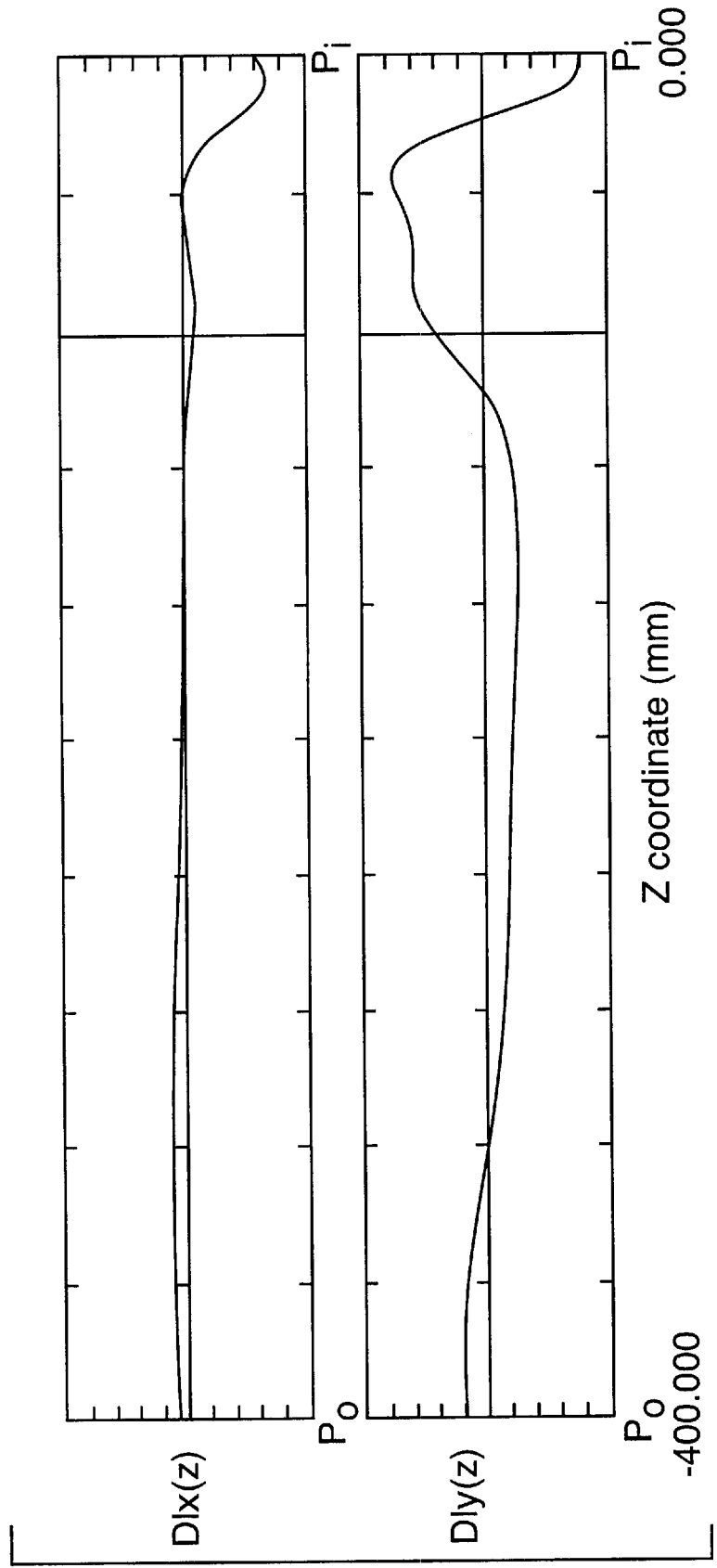
FIG. 18 includes, with respect to the sixth representative embodiment, exemplary plots of the deflection field generated between the object surface $P_o$ and the image surface $P_i$.

FIG. 18 depicts two plots of the deflection field generated by this embodiment between the object surface $P_o$ and the image surface $P_i$. Dlx(z) denotes the X-direction component of the deflection field, and Dly(z) denotes the Y-direction component of the deflection field. Distances along the optical axis (i.e., the Z-axis) are plotted on the abscissa, wherein the image surface $P_i$ is regarded as the origin and the direction from the image surface $P_i$ to the object surface $P_o$ is regarded as a positive Z-direction. The electrical current supplied to each of the constitutive micro-deflectors Dga of the deflector group Ga and the electrical current supplied to each of the constitutive micro-deflectors Dgb of the deflector group Gb are adjusted so that the overall deflection field formed by the deflector groups Ga and Gb conforms to the deflection-field profile shown in FIG. 18.

In the optical system shown in FIG. 10, the radial angular orientations of the deflectors $Da_1$–$Da_3$ and $Db_1$–$Db_3$ were optimized so as to minimize aberrations. In the present embodiment, in the deflector groups Ga and Gb shown in FIG. 16, the radial angular orientations of the micro-deflectors Dga and Dgb can be set as desired by adjusting the ratio of the electrical current supplied to the coil $a_1$ to the electrical current supplied to the coil $b_1$ while keeping constant the ratio of the current supplied to the coil $b_1$ to the current supplied to the coil $b_2$, and keeping constant the ratio of the electrical current supplied to the coil $a_1$ to the electrical current supplied to the coil $a_2$.

The deflection field created in the FIG. 10 embodiment by the deflectors $Da_1$–$Da_3$ and $Db_1$–$Db_3$ is reproduced in the present embodiment using the deflector group Ga consisting of the multiple micro-deflectors Dga and the deflector group Gb consisting of the multiple micro-deflectors Dgb. Hence, the optical system of the present embodiment achieves the same advantages as that of the FIG. 10 embodiment. Moreover, in the present embodiment, the deflection system situated closer to the object side consists of the respective deflector group Ga, and the deflection system situated closer to the image side consists of the respective deflector group Gb. Use of the deflector groups Ga, Gb rather than individual deflectors simplifies positional calibration relative to the optical axis. I.e., individual deflectors must be individually positioned relative to the optical axis. Hence, six deflectors requires six different positional calibrations. Use of two deflector groups requires only two such positional calibrations, which simplifies construction and maintenance. Also, the axial coordinate can also be adjusted by controlling the electrical current supplied to each of the micro-deflectors in each of the deflector groups, resulting in improved maintainability.

Also, in this embodiment, each of the deflector groups Ga, Gb can be formed using micro-deflectors having different shapes and sizes. The shape of each micro-deflector preferably is configured to eliminate fifth-order 4-fold aberrations. Alternatively, micro-deflectors having any of various other shapes may be used if they provide satisfactory reduction in fifth-order aberrations.

With respect to the components used in the fifth and sixth embodiments, the deflectors $Da_1$–$Da_3$ and $Db_1$–$Db_3$ are "aberration-correcting deflectors." The micro-deflectors Dga are "first micro-deflectors" and the micro-deflectors Dgb are "second micro-deflectors." The deflector group Ga is a "first deflector group" and the deflector group Gb is a "second deflector group."

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. An apparatus for projecting an image of a pattern, defined by a reticle, onto a substrate using a charged particle beam, comprising:

a projection-optical system situated and configured so as to receive a charged particle beam passing through an illuminated region of the reticle and form an image of the illuminated region on a corresponding region of the substrate, the projection-optical system satisfying a Symmetric Magnetic Doublet condition and having a column length (L) and a demagnification ratio (1/M); and six deflectors associated with the projection-optical system, the deflectors being configured and situated to correct an on-axis aberration of the beam and a corresponding off-axis aberration of the beam, wherein the off-axis aberration is corrected substantially equally with the correction of the on-axis aberration, the six deflectors having axial positions, relative to an axial position of the substrate, of ($Z_1$), ($Z_2$), ($Z_3$), ($Z_4$), ($Z_5$), and ($Z_6$), respectively, that satisfy the expressions:

$$Z_1=(-L)-M(Z_6)$$
$$Z_2=(-L)-M(Z_5)$$
$$Z_3=(-L)-M(Z_4)$$

wherein an axial direction leading from the substrate to the reticle is regarded as a negative axial direction.

2. An apparatus for projecting an image of a pattern, defined by a reticle, onto a substrate using a charged particle beam, comprising:

a projection-lens system configured and situated so as to (i) receive a charged particle beam passing through an illuminated region of the reticle and form an image of the illuminated region on a corresponding region of the substrate, (ii) form a lens field, and (iii) satisfy a Symmetric Magnetic Doublet condition;

a deflector system configured and situated so as to form a deflection field, the deflector system comprising a first set of at least two deflectors axially arranged on a reticle side of the projection-lens system, and a second set of at least two deflectors axially arranged on a substrate side of the projection-lens system, the deflector system performing a correction of third-order aberrations of the beam sufficiently such that off-axis third-order aberrations are corrected substantially equally with correction of on-axis third-order aberrations; and the deflectors of the first set having respective inside radii and the deflectors of the second set having respective inside radii, the respective inside radii being configured so as to reduce fifth-order blur generated by deflection of the beam.

3. The apparatus of claim 2, wherein:

the projection-lens system has a demagnification ratio (1/M);

each of the deflectors in the first set has a respective axial length, inside radius, and outside radius, and each of the deflectors in the second set has a respective axial length, inside radius, and outside radius; and the inside radius, outside radius, and axial length, respectively, of the deflectors in the first set are M times the inside radius, outside radius, and axial length, respectively, of the deflectors in the second set.

4. The apparatus of claim 3, wherein:

each of the first and second sets of deflectors comprises "n" respective deflectors, wherein n is an integer greater than two;

the respective nth deflectors of the first and second deflector sets are axially situated closest to each other of all the deflectors in the first and second deflector sets, respectively; and the respective nth deflector of the first and second deflector sets have a smaller inside radius, outside radius, and axial length of any of the other deflectors in the respective first and second deflector sets.

5. In an apparatus for projecting an image of a pattern, defined by a reticle, onto a substrate using a charged particle beam, the apparatus comprising a projection-optical system situated between the reticle and the substrate, an aberration-reducing improvement, comprising:

a first set of "n" (n≧2) deflectors ($Da_1$), ($Da_2$), ..., ($Da_n$) situated in such order on a reticle side of the projection-optical system, each deflector in the first set having a respective inside diameter, outside diameter, and axial length;

a second set of "n" (n≧2) deflectors ($Db_1$), ($Db_2$), ..., ($Db_n$) situated in such order on a substrate side of the projection-optical system, each deflector in the second set having a respective inside diameter, outside diameter, and axial length;

the nth deflector ($Da_n$) in the first set having an inside radius, outside radius, and axial length that individually are smaller than an inside radius, outside radius, and axial length, respectively, of all other deflectors in the first set; and the nth deflector ($Db_n$) in the second set having an inside radius, outside radius, and axial length that individually are smaller than an inside radius, outside radius, and axial length, respectively, of all other deflectors in the second set.

6. A projection-optical system for a charged-particle-beam microlithography apparatus, comprising:

a projection lens situated and configured so as to receive a charged particle beam passing through an illuminated region of the reticle and form an image of the illuminated region on a corresponding region of the substrate, the projection lens having an image side and a substrate side;

a deflector system associated with the projection-lens, the deflector system comprising a first deflector set associated with the image side of the projection lens and a second deflector set associated with the object side of the projection lens, each of the first and second deflector sets comprising multiple deflectors; and at least one deflector of the first deflector set comprising an axial array of multiple micro-deflectors each having a similar radial angular orientation as the respective deflector, and at least one deflector of the second deflector set comprising an axial array of multiple micro-deflectors each having a similar radial angular orientation as the respective deflector.

7. The apparatus of claim 6, wherein:

each micro-deflector of the first deflector set is independently and adjustably energizable such that the array of micro-deflectors of the first deflector set collectively produces a deflection field similar to a deflection field that otherwise would be produced by the respective deflector in the first deflector set; and each micro-deflector of the second deflector set is independently and adjustably energizable such that the array of micro-deflectors of the second deflector set collectively produces a deflection field similar to a deflection field that would otherwise be produced by the respective deflector in the second deflector set.

8. The apparatus of claim 7, wherein:

the micro-deflectors in a set have an inside radius (R1), an outside radius (R2), an axial length (L), and an axial spacing (S) therebetween; and the micro-deflectors in the set satisfy the expressions:

$$0.02 \leq R_1/K \leq 0.20$$

$$0.02 < R_2/K \leq 0.30$$

$$0.01 \leq L/K \leq 0.05$$

$$0.001 \leq S/K \leq 0.05$$

wherein K is an axial distance between the reticle and the substrate.

9. The apparatus of claim 6, wherein:

the first and second deflector sets collectively impart a correction of off-axis third-order aberrations and on-axis third-order aberrations; and the correction imparted to the off-axis third-order aberrations is substantially equal to the correction imparted to the on-axis third-order aberrations.

10. The apparatus of claim 9, wherein each of the first and second deflector sets comprises three deflectors.

11. A projection-optical system for a charged-particle-beam microlithography apparatus, comprising:

a projection lens situated and configured so as to receive a charged particle beam passing through an illuminated region of the reticle and form an image of the illuminated region on a corresponding region of the substrate, the projection lens having an object surface, an aperture surface, and an image surface;

a deflector system associated with the projection-lens, the deflector system comprising first and second deflector sets;

the first deflector set comprising multiple micro-deflectors linearly arrayed in an axial direction between the object surface and the aperture surface; and the second deflector set comprising multiple micro-deflectors linearly arrayed in an axial direction between the image surface and the aperture surface, wherein each of the micro-deflectors of the first deflector set and of the second deflector set has an inside radius ($R_1$), an outside radius ($R_2$), an axial length (L), and an axial spacing (S) therebetween, and each micro-deflector satisfies the expressions:

$$0.02 < R_1/K < 0.20$$

$$0.02 < R_2/K < 0.30$$

$$0.01 < L/K < 0.05$$

$$0.001 < S/K < 0.05$$

wherein K is an axial distance between the object surface and the image surface.

12. A projection-optical system for a charged-particle-beam microlithography apparatus, comprising:

a projection lens situated and configured so as to receive a charged particle beam passing through an illuminated region of the reticle and form an image of the illuminated region on a corresponding region of the substrate, the projection lens having an object surface, an aperture surface, and an image surface;

a deflector system comprising first and second deflector sets, the first deflector set comprising three deflectors and being situated between the object surface and the aperture surface, and the second deflector set comprising three deflectors and being situated between the aperture surface and the image surface, the first and second deflector sets being operable to impart respective corrections of off-axis third-order aberrations and on-axis third-order aberrations of the projection lens, the correction of the off-axis third-order aberrations being substantially equal to the correction of on-axis third-order aberrations;

each deflector of the first deflector set comprising respective multiple micro-deflectors linearly arrayed in an axial direction;

each deflector of the second deflector set comprising respective multiple micro-deflectors linearly arrayed in an axial direction;

each of the micro-deflectors of the first deflector set and of the second deflector set has an inside radius ($R_1$), an outside radius ($R_2$), an axial length (L), and an axial spacing (S) therebetween; and each micro-deflector satisfies the expressions:

$$0.02 \leq R_1/K \leq 0.20$$

$$0.02 < R_2/K \leq 0.30$$

$$0.01 \leq L/K \leq 0.05$$

$$0.001 \leq S/K \leq 0.05$$

wherein K is an axial distance between the object surface and the image surface.

13. An apparatus for projecting an image of a pattern, defined by a reticle, onto a substrate using a charged particle beam, comprising:

a projection-optical system situated and configured so as to receive a charged particle beam passing through an illuminated region of the reticle and form an image of the illuminated region on a corresponding region of the substrate, the projection-optical system having an optical axis, an object surface, an aperture surface, and an image surface;

a first deflector set situated at a first axial position between the object surface and the aperture surface, and a second deflector set situated at a second axial position between the aperture surface and the image surface, the first deflector set comprising aberration-correcting deflectors ($Da_1$), ($Da_2$), ($Da_3$) each having a respective radial angular orientation about the optical axis at the first axial position, and the second deflector set comprising aberration-correcting deflectors ($Db_1$), ($Db_2$), ($Db_3$) each having a respective radial angular orientation about the optical axis at the second axial position; and the deflector ($Da_2$) comprising a deflector group ($Dg_2$) comprising multiple (n) micro-deflectors ($Dg_{2,1}$), ($Dg_{2,2}$), . . . , ($Dg_{2,n}$) linearly arrayed in an axial direction at the same radial angular orientation as the deflector ($Da_2$), each micro-deflector ($Dg_{2,1}$), ($Dg_{2,2}$), ..., ($Dg_{2,n}$) being independently energizable so as to collectively form a deflection field that would otherwise be formed by a single deflector ($Da_2$).

14. The apparatus of claim 13, wherein:

each of the micro-deflectors ($Dg_{2,1}$), ($Dg_{2,2}$), ..., ($Dg_{2,n}$) has an inside radius ($R_1$), an outside radius ($R_2$), an axial length (L), and an axial spacing (S) therebetween; and each said micro-deflector satisfies the expressions:

$$0.02 \leq R_1/K \leq 0.20$$

$$0.02 < R_2/K \leq 0.30$$

$$0.01 \leq L/K \leq 0.05$$

$$0.001 \leq S/K \leq 0.05$$

wherein K is an axial distance between the object surface and the image surface.

15. The apparatus of claim 14, wherein the first and second deflector sets are collectively operable to form a deflector field that corrects on-axis third-order aberrations and off-axis third-order aberrations of the projection-optical system, the off-axis third-order aberrations and on-axis third-order aberrations being corrected substantially equally.

16. An apparatus for projecting an image of a pattern, defined by a reticle, onto a substrate using a charged particle beam, comprising:

a projection-optical system situated and configured so as to receive a charged particle beam passing through an illuminated region of the reticle and form an image of the illuminated region on a corresponding region of the substrate, the projection-optical system having an optical axis, an object surface, an aperture surface, and an image surface; and an aberration-correcting deflection system comprising first and second deflector groups, the first deflector group comprising multiple first micro-deflectors linearly arrayed in an axial direction between the object surface and the aperture surface, and the second deflector group comprising multiple second micro-deflectors linearly arrayed in an axial direction between the aperture surface and the image surface, wherein each of the micro-deflectors of the first and second deflector groups has an inside radius ($R_1$), an outside radius ($R_2$), an axial length (L), and an axial spacing (S) therebetween, and each said micro-deflector satisfies the expressions:

$$0.02 < R_1/K < 0.20$$

$$0.02 < R_2K < 0.30$$

$$0.01 < L/K < 0.05$$

$$0.001 < S/K < 0.05$$

wherein K is an axial distance between the object surface and the image surface.

17. An apparatus for projecting an image of a pattern, defined by a reticle, onto a substrate using a charged particle beam, comprising:

a projection-optical system situated so as to receive a charged particle beam passing through an illuminated region of the reticle and form an image of the illuminated region on a corresponding region of the substrate, the projection-optical system comprising a first, or reticle-side, projection lens and a second, or substrate side, projection lens each configured so as to satisfy a Symmetric Magnetic Doublet condition;

a first deflector set associated with the first projection lens and forming a beam-deflecting first field, the first deflector set comprising first, second, and third deflectors; and a second deflector set associated with the second projection lens and forming a beam-deflecting second field, the second deflector set comprising first, second, and third deflectors, the first and second deflector sets deflecting the beam so as to impart a respective correction of on-axis third-order aberrations and a respective correction of off-axis third-order aberrations, wherein the correction of off-axis third-order aberrations is substantially equal to the correction of on-axis third-order aberrations;

wherein each of the deflectors of the first deflector set has a respective inside radius and each of the deflectors of the second deflector set has a respective inside radius, the respective inside radii being configured so as to impart a respective reduction of fifth-order blur of the beam as projected onto the substrate.

18. The apparatus of claim 17, wherein:

each of the deflectors of the first deflector set has a respective inside radius, outside radius, and respective axial length, and each of the deflectors of the second deflector set has a respective inside radius, outside radius, and respective axial length; and the respective inside radius, outside radius, and axial length of each deflector in the second deflector set being 1/M of the respective inside radius, outside radius, and axial length of the corresponding deflector in the first deflector set, wherein 1/M is a demagnification ratio of the projection-optical system.

19. The apparatus of claim 18, wherein:

each of the first and second deflector sets comprises "n" respective deflectors, wherein n is an integer greater than two;

the respective nth deflectors of the first and second deflector sets are axially situated closest to each other of all the deflectors in the first and second deflector sets, respectively; and the respective nth deflector of the first and second deflector sets have a smaller inside radius, outside radius, and axial length of any of the other deflectors in the respective first and second deflector sets.

20. The apparatus of claim 17, wherein:

each of the first and second deflector sets comprises "n" respective deflectors, wherein n is an integer greater than two;

the respective nth deflectors of the first and second deflector sets are axially situated closest to each other of all the deflectors in the first and second deflector sets, respectively; and the respective nth deflector of the first and second deflector sets have a smaller inside radius, outside radius, and axial length of any of the other deflectors in the respective first and second deflector sets.

21. An apparatus for projecting an image of a pattern, defined by a reticle, onto a substrate using a charged particle beam, comprising:

a projection-optical system situated so as to receive a charged particle beam passing through an illuminated region of the reticle and form an image of the illuminated region on a corresponding region of the substrate, the projection-optical system comprising a first, or reticle-side, projection lens and a second, or substrate side, projection lens each configured so as to satisfy a Symmetric Magnetic Doublet condition;

a first deflector set associated with the first projection lens and forming a beam-deflecting first field, the first deflector set comprising "n" deflectors, wherein "n" is an integer greater than two;

a second deflector set associated with the second projection lens and forming a beam-deflecting second field, the second deflector set comprising "n" deflectors, wherein "n" is an integer greater than two;

the respective nth deflectors of the first and second deflector sets being axially situated closest to each other of all the deflectors in the first and second deflector sets, respectively; and the respective nth deflector of the first and second deflector sets having a smaller inside radius, outside radius, and axial length of any of the other deflectors in the respective first and second deflector sets.

* * * * *

UNITED STATES PATENT AND TRADEMARK OFFICE
CERTIFICATE OF CORRECTION

PATENT NO. : 6,376,842 B1
DATED : April 23, 2002
INVENTOR(S) : Atsushi Yamada

It is certified that error appears in the above-identified patent and that said Letters Patent is hereby corrected as shown below:

Column 5,
Line 48, change "apparatus" to -- apparatus. --.

Column 6,
Line 14, change "is schematic" to -- is a schematic --.

Column 11,
Line 9, change ""$b_1$" "$b_2$"" to -- "$b_1$", "$b_2$". --.

Column 18,
Line 33, change "Dh3" to -- $Dh_3$ --.

Column 20,
Line 23, change "FIG. 1 6," to -- FIG. 16 --.
Line 25, change "a1" to -- $a_1$ --.
Line 47, change "requires" to -- require --.

Column 23,
Line 12, change "(R1)" to -- $(R_1)$ --.
Line 13, change "(R2)" to -- $(R_2)$ --.

Column 25,
Line 23, change "claim 14" to -- claim 13 --.
Line 55, change "$R_2K$" to -- $R_2/K$ --.

Signed and Sealed this

Twenty-first Day of January, 2003

JAMES E. ROGAN
*Director of the United States Patent and Trademark Office*